(12) United States Patent
Sugitani et al.

(10) Patent No.: US 11,937,450 B2
(45) Date of Patent: Mar. 19, 2024

(54) DISPLAY APPARATUS

(71) Applicant: Samsung Display Co., Ltd., Yongin-Si (KR)

(72) Inventors: Koichi Sugitani, Suwon-si (KR); Jin-su Byun, Seoul (KR); Gwangmin Cha, Hwaseong-si (KR); Saehee Han, Seoul (KR); Hoon Kang, Yongin-si (KR); Jin-lak Kim, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 85 days.

(21) Appl. No.: 16/514,480

(22) Filed: Jul. 17, 2019

(65) Prior Publication Data

US 2020/0028120 A1  Jan. 23, 2020

(30) Foreign Application Priority Data

Jul. 19, 2018 (KR) .................. 10-2018-0084195

(51) Int. Cl.
*H10K 50/858* (2023.01)
*G02B 27/01* (2006.01)
(Continued)

(52) U.S. Cl.
CPC ......... *H10K 50/858* (2023.02); *G02F 1/0316* (2013.01); *H10K 50/844* (2023.02);
(Continued)

(58) Field of Classification Search
CPC ............. G02F 1/0316; G02F 1/134309; G02F 1/133528; G02F 1/13363; H01L 51/5275; H01L 51/5262; H01L 51/5253; H01L 27/3232; H01L 27/3206; H01L 27/3216; H01L 27/3218; H01L 27/3241; H01L 27/3244; H01L 27/3237; H01L 27/32; H01L 27/326; H01L 27/3225; H01L 2251/30; H01L 2251/301; H01L 2251/303; H10K 50/858; H10K 50/879; H10K 50/85; H10K 50/875; H10K 50/844; H10K 59/50;
(Continued)

(56) References Cited

U.S. PATENT DOCUMENTS 8,298,032 B2  10/2012 Potts et al.
10,141,382 B2 11/2018 Choi et al.
(Continued)

FOREIGN PATENT DOCUMENTS

JP  2004103507 A  4/2004
JP  2012142182 A  7/2012
(Continued)

*Primary Examiner* — Shaun M Campbell
*Assistant Examiner* — Aneta B Cieslewicz
(74) *Attorney, Agent, or Firm* — CANTOR COLBURN LLP

(57) ABSTRACT

A display apparatus includes a display module including a display surface. The display module includes a display panel including a plurality of display devices which displays an image on the display surface, a plurality of light concentration lenses arranged on the display panel, a buffer layer disposed on the light concentration lenses, and a plurality of diffraction patterns arranged at regular intervals on the buffer layer, where the diffraction patterns diffract a portion of lights incident thereto.

26 Claims, 20 Drawing Sheets

(51) Int. Cl.
*G02F 1/03* (2006.01)
*G02F 1/1335* (2006.01)
*H10K 50/844* (2023.01)
*H10K 59/00* (2023.01)
*H10K 59/10* (2023.01)
*H10K 59/12* (2023.01)
*H10K 59/50* (2023.01)
H10K 59/30 (2023.01)
H10K 59/35 (2023.01)
H10K 102/00 (2023.01)

(52) U.S. Cl.
CPC ............. *H10K 59/10* (2023.02); *H10K 59/12* (2023.02); *G02B 27/01* (2013.01); *G02F 1/133528* (2013.01); *G09G 2300/0439* (2013.01); *H10K 59/00* (2023.02); *H10K 59/30* (2023.02); *H10K 59/352* (2023.02); *H10K 59/353* (2023.02); *H10K 59/50* (2023.02); *H10K 2102/00* (2023.02)

(58) Field of Classification Search
CPC .. H10K 59/873; H10K 59/352; H10K 59/353; H10K 59/70; H10K 59/80–88; H10K 59/30; H10K 59/10; H10K 59/19; H10K 59/12; H10K 59/131; H10K 59/1315; H10K 2102/00; H10K 2101/00; G02B 27/01; G09G 2300/0439
See application file for complete search history.

(56) References Cited

U.S. PATENT DOCUMENTS

| | | | |
|---|---|---|---|
| 10,734,610 B2 | 8/2020 | Li et al. | |
| 2003/0067460 A1* | 4/2003 | Tomono | H04N 13/317 345/419 |
| 2004/0051447 A1* | 3/2004 | Okinaka | H01L 51/5275 313/504 |
| 2005/0168491 A1* | 8/2005 | Takahara | G09G 3/3241 345/690 |
| 2006/0125388 A1* | 6/2006 | Song | H05B 33/22 313/506 |
| 2008/0074742 A1* | 3/2008 | Kim | H04N 13/305 359/463 |
| 2009/0302744 A1* | 12/2009 | Kim | H01L 51/5253 313/504 |
| 2011/0121271 A1 | 5/2011 | Jeon et al. | |
| 2012/0127376 A1* | 5/2012 | Shikina | H01L 51/5284 348/800 |
| 2012/0281157 A1* | 11/2012 | Kim | G02F 1/13363 349/15 |
| 2012/0300307 A1* | 11/2012 | Borrelli | G02F 1/133504 359/609 |
| 2013/0001609 A1* | 1/2013 | Ichinose | H01L 51/5275 257/89 |
| 2013/0001610 A1* | 1/2013 | Iwakura | H01L 27/3223 257/91 |
| 2013/0002690 A1* | 1/2013 | Ichinose | H01L 51/5275 345/522 |
| 2013/0032914 A1* | 2/2013 | Iwasaki | H01L 27/14621 257/432 |
| 2013/0107174 A1* | 5/2013 | Yun | G02B 30/28 349/200 |
| 2014/0034919 A1* | 2/2014 | Park | H01L 51/5275 257/40 |
| 2014/0054572 A1* | 2/2014 | Li | H01L 51/5268 257/40 |
| 2015/0048333 A1 | 2/2015 | Choi et al. | |
| 2016/0020431 A1* | 1/2016 | Yamae | H01L 51/5268 257/40 |
| 2016/0209958 A1* | 7/2016 | Choi | G06F 3/0418 |
| 2018/0314067 A1 | 11/2018 | Cho et al. | |
| 2018/0350883 A1 | 12/2018 | Lee et al. | |
| 2019/0041658 A1* | 2/2019 | Gollier | G02B 27/1066 |
| 2019/0086671 A1* | 3/2019 | Kim | G02B 17/002 |

FOREIGN PATENT DOCUMENTS

| | | |
|---|---|---|
| KR | 1020030030365 A | 4/2003 |
| KR | 1020080027559 A | 3/2008 |
| KR | 1020110058126 A | 6/2011 |
| KR | 1020120124525 A | 11/2012 |
| KR | 1020140018548 A | 2/2014 |
| KR | 1020150019325 A | 2/2015 |
| KR | 1020150081630 A | 7/2015 |
| KR | 1020160032970 A | 3/2016 |
| KR | 1020160088532 A | 7/2016 |
| KR | 1020180121750 A | 11/2018 |
| KR | 1020180133024 A | 12/2018 |
| WO | 2017139245 A1 | 8/2017 |

* cited by examiner

DISPLAY APPARATUS

This application claims priority to Korean Patent Application No. 10-2018-0084195, filed on Jul. 19, 2018, and all the benefits accruing therefrom under 35 U.S.C. § 119, the content of which in its entirety is herein incorporated by reference.

BACKGROUND

1. Field

The disclosure herein relates to a display apparatus, and more particularly, to a slim display apparatus with improved display quality.

2. Description of the Related Art

With the development of multimedia, display apparatus are becoming more important. For such multimedia, various types of display apparatus such as liquid crystal displays ("LCD"s), organic light-emitting displays ("OLED"s), etc., are used.

The liquid crystal displays, the organic light-emitting displays, etc. may be applied to a head mount display device. The head mount display device may be mounted on the head of a user, and may have a shape of glasses, helmet, etc. The head mount display devices may display images in front of the eyes of a user so that the user may recognize images.

SUMMARY

The disclosure provides a slim display apparatus having high display quality.

An embodiment of the invention provides a display apparatus including a display module defining a display surface in a surface thereof. In such an embodiment, the display module includes: a display panel including a plurality of display devices which displays an image on the display surface; a plurality of light concentration lenses arranged on the display panel; a buffer layer disposed on the light concentration lenses; and a plurality of diffraction patterns arranged at regular intervals on the buffer layer, where the diffraction patterns diffract lights incident thereto.

In an embodiment, a portion of the lights diffracted by the diffraction patterns may constructively interfere with each other.

In an embodiment, the display devices may display pixel unit images, respectively, on the display surface, the portion of the lights, which constructively interfere with each other, may display replication unit images on the display surface, the image may be defined by the pixel unit images and the replication unit images, and each of the replication unit images may be displayed between adjacent pixel unit images on the display surface.

In an embodiment, each of the display devices may include an organic light-emitting device.

In an embodiment, the display panel may further include a protective layer covering the organic light-emitting devices.

In an embodiment, each of the light concentration lenses may be disposed directly on upper surfaces of the display devices to cover the display devices.

In an embodiment, a distance from an upper surface of the organic light-emitting device to an upper surface of the buffer layer may be defined as an optical distance, and the optical distance may be in a range from about 50 micrometers (μm) to about 150 μm.

In an embodiment, the replication unit images may be displayed by a red light.

In an embodiment, one of the adjacent pixel unit images may be displayed by the red light, and another of the adjacent pixel unit images may be displayed by a blue light.

In an embodiment, on the display surface, a distance between a center of one pixel unit image adjacent to a replication unit image, among the pixel unit images, and a center of the replication unit image may be about 25 μm or less.

In an embodiment, a plurality of replication unit images may be displayed between adjacent pixel unit images on the display surface, and the plurality of replication unit images may include: a first replication unit image disposed adjacent to one pixel unit image of the adjacent pixel unit images on the display surface; and a second replication unit image facing the one pixel unit image with the first replication unit images therebetween.

In an embodiment, an interval between the diffraction patterns may be in a range from about 4.5 μm to about 7.5 μm.

In an embodiment, a radius of curvature of each of the light concentration lenses may be in a range from about 7 μm to about 14 μm.

In an embodiment, a refractive index of the buffer layer may be lower than a refractive index of each of the light concentration lenses.

In an embodiment, a refractive index of the diffraction patterns may be the same as a refractive index of the buffer layer.

In an embodiment, the display apparatus may further include a sub-buffer layer disposed between the light concentration lenses and the display panel.

In an embodiment, each of the display devices may include a liquid crystal capacitor, and the liquid crystal capacitor may include: a pixel electrode corresponding to the pixel unit image; a common electrode disposed on the pixel electrode; and a liquid crystal layer interposed between the pixel electrode and the common electrode.

In an embodiment, the display apparatus may further include an input sensing layer disposed on the display module, the input sensing layer including a plurality of input sensing electrodes.

In an embodiment, the display apparatus may further include: a reflection preventive layer disposed on the display module, where the reflection preventive layer may include: a phase delay layer which delays a component of incident light; and a polarization layer disposed on the phase delay layer.

In an embodiment, the diffraction patterns may be in a matrix form.

In an embodiment, the diffraction patterns may be in a stripe form.

In an embodiment, an area occupied by each of the light concentration lenses in a plan view may be larger than an area occupied by each of the display devices in a plan view.

In an embodiment, the display module may further include a cover layer covering the diffraction patterns.

In an embodiment, the display apparatus may further include: an optical system disposed in a path of light emitted from the display module to enlarge the image displayed on the display surface, where the display surface may include a left-eye image display area and a right-eye image display area.

In an embodiment of the invention, a display apparatus includes a display module defining a display surface including a plurality of light-emitting areas and a plurality of replication areas in a surface thereof. In such an embodiment, the display module includes: a display panel which displays an image on each of the light-emitting areas; a plurality of light concentration lenses arranged between the display panel and the display surface, where the light concentration lenses change a direction of light incident thereto into a direction closer to a direction towards the display surface; a buffer layer disposed between the light concentration lenses and the display surface; and a plurality of diffraction patterns arranged between the buffer layer and the display surface at regular intervals on the buffer layer, where the diffraction patterns diffract light incident thereto to display an image on each of the replication areas. In such an embodiment, the replication areas are arranged around one of the light-emitting areas on the display surface.

In an embodiment of the invention, a display apparatus includes: a display module defining a display surface including a right-eye display area and a left-eye display area, where the display module emits light; and an optical system including a lens disposed in a path of light emitted from the display module to enlarge an image display by the light. In such an embodiment, the display module includes: a display panel including a plurality of pixels which displays an image on each of the right-eye display area and the left-eye display area; a plurality of light concentration lenses arranged on the display panel; a buffer layer disposed on the light concentration lenses; and a plurality of diffraction patterns arranged at regular intervals on the buffer layer, where the diffraction patterns diffract a portion of lights incident thereto.

BRIEF DESCRIPTION OF THE FIGURES

These and/or other features of the invention will become apparent and more readily appreciated from the following description of the exemplary embodiments, taken in conjunction with the accompanying drawings, in which.

DETAILED DESCRIPTION

Figure 1:
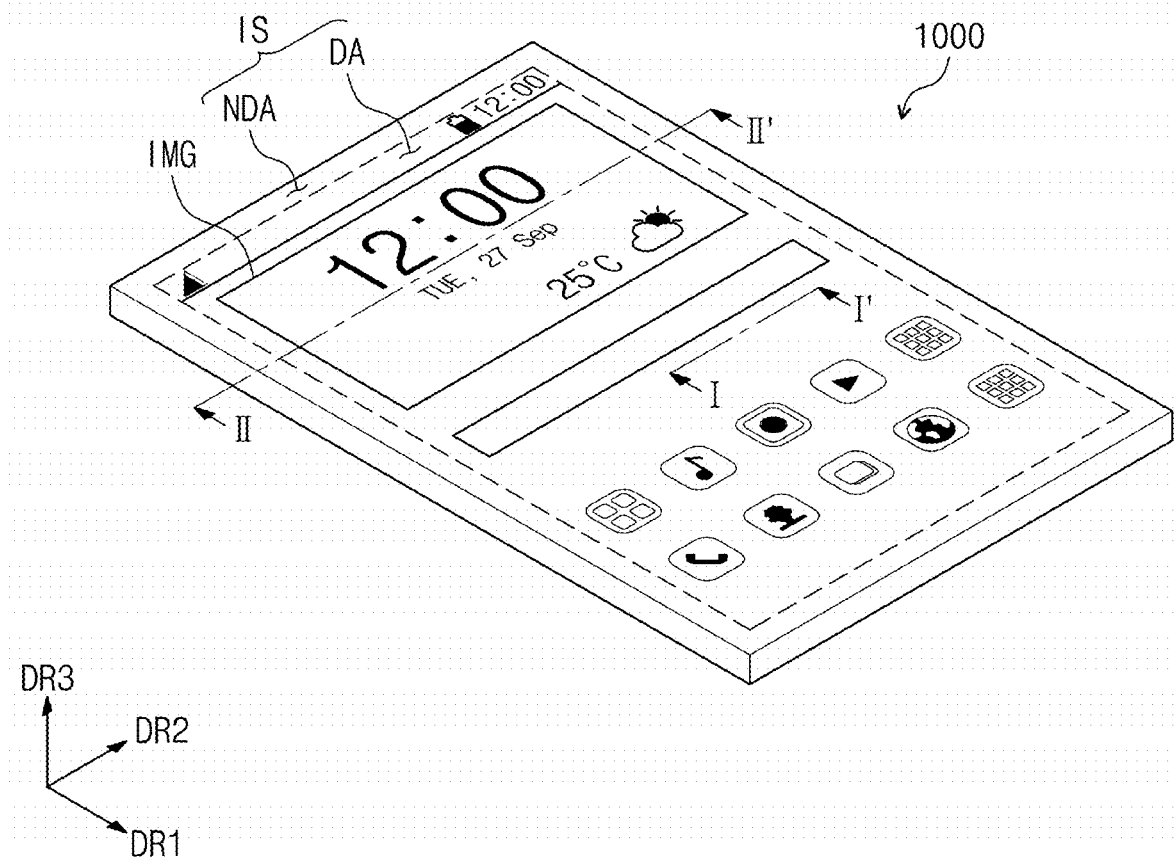
FIG. 1 is a perspective view of a display apparatus according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element (or a region, layer, portion, or the like) is referred to as being "on", "connected to", or "coupled to" another element, it can be directly on or directly connected/coupled to the other element, or a third element may be present therebetween. In contrast, when an element is referred to as being "directly on," "directly connected to", or "directly coupled to" another element, there are no intervening elements present.

Like reference numerals refer to like elements throughout. In the drawings, the thicknesses, ratios, and dimensions of elements are exaggerated for clarity of illustration.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

The terms "first", "second" and the like may be used for describing various elements, but the elements should not be construed as being limited by the terms. Such terms are only used for distinguishing one element from other elements. For example, a first element could be termed a second element and vice versa without departing from the teachings of the disclosure. The terms of a singular form may include plural forms unless otherwise specified.

Furthermore, the terms "under", "lower side", "on", "upper side", and the like are used to describe association relationships among elements illustrated in the drawings. The terms, which are relative concepts, are used on the basis of directions illustrated in the drawings.

All of the terms used herein (including technical and scientific terms) have the same meanings as understood by those skilled in the art, unless otherwise defined. Terms in common usage such as those defined in commonly used dictionaries should be interpreted to contextually match the meanings in the relevant art, and are explicitly defined herein unless interpreted in an idealized or overly formal sense.

It will be further understood that the terms "include", "including", "has", "having", and the like, when used in this specification, specify the presence of stated features, numbers, steps, operations, elements, components, or combinations thereof, but do not preclude the presence or addition of one or more other features, numbers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

Figure 2:
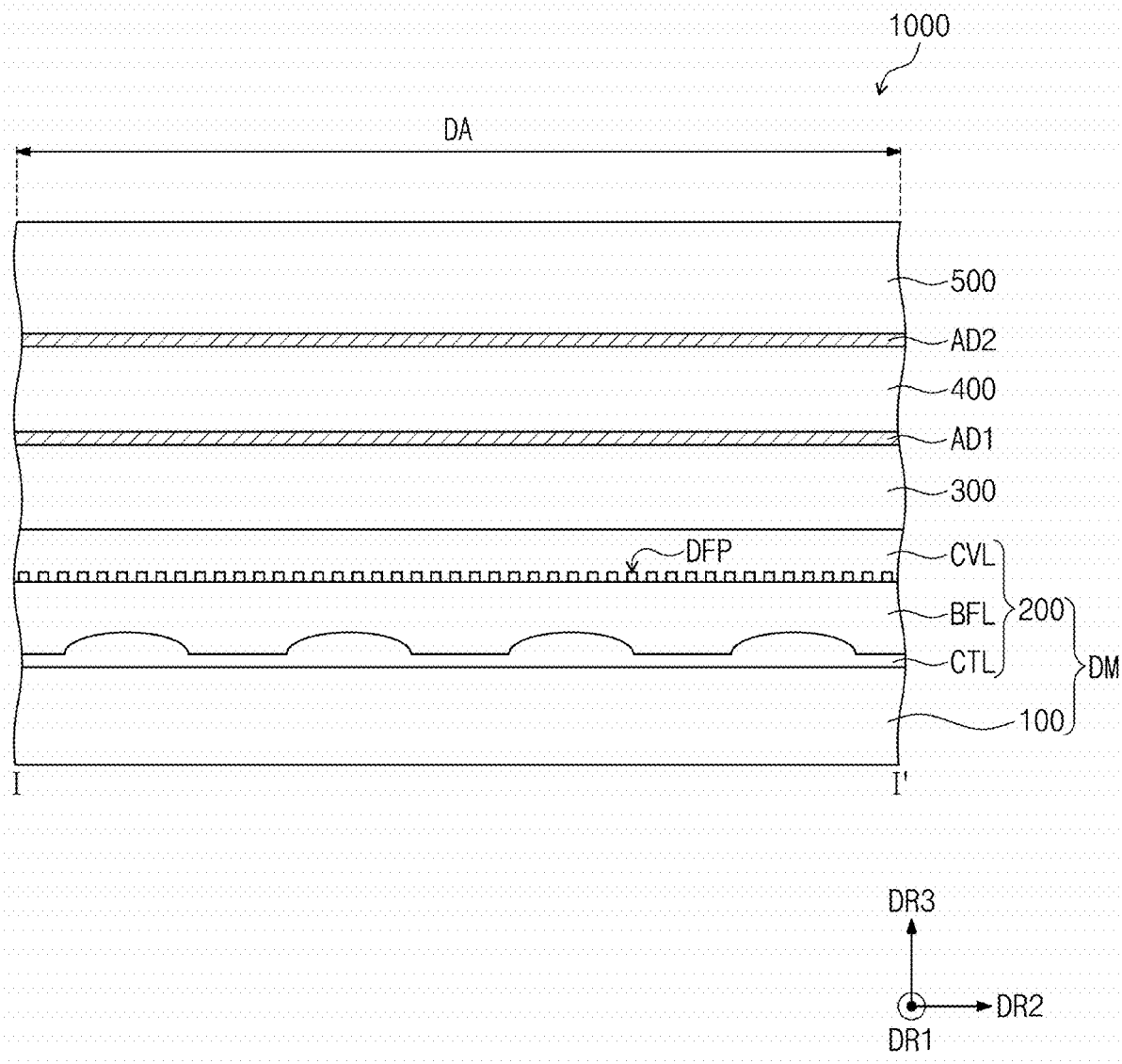
FIG. 2 is a cross-sectional view of the display apparatus taken along line I-I' of FIG. 1.

FIG. 1 is a perspective view of a display apparatus according to an embodiment of the invention, and FIG. 2 is a cross-sectional view of the display apparatus taken along line I-I' of FIG. 1.

Referring to FIGS. 1 and 2, an embodiment of a display apparatus 1000 has a rectangular shape with a long side in a first direction DR1 and a short side in a second direction DR2 perpendicular to the first direction DR1. However, the shape of the display apparatus described above is merely exemplary for ease of description, and the shape of the display apparatus 1000 is not particularly limited.

In an embodiment, the display apparatus 1000 defines a display surface IS including a display area DA and a non-display area NDA on a plane defined by the first direction DR1 and the second direction DR2. The display area DA may be defined in a central region of the display apparatus 1000. In such an embodiment, the display area DA may display an image IMG, and the non-display area NDA has a frame shape surrounding the display area DA on the plane. The non-display area NDA does not display an image. The shapes of the display area DA and non-display area NDA are not particularly limited.

Herein, a normal direction of the display surface IS, i.e., a direction in which the image IMG is displayed, is defined as a third direction DR3. A front surface (or top surface) and rear surface (or bottom surface) of each member may be differentiated by the third direction DR3. However, the directions indicated by the first to third directions DR1 to DR3 are relative directions and thus may be changed to other directions.

The display apparatus 1000 includes a display module DM. In an embodiment, the display surface IS may be defined on a top surface of the display module DM. The display module DM includes a display panel 100 including a plurality of display devices (not shown) for displaying an image and an optical member 200 disposed on the display panel 100. The display panel 100 and the optical member 200 will be described later in greater detail with reference to FIGS. 3 to 11

In an embodiment, as shown in FIG. 2, the display apparatus 1000 may further include an input sensing layer 300, a reflection preventive (or antireflection) layer 400, and a window member 500.

The input sensing layer 300 is disposed on the display module DM. The input sensing layer 300 senses an external input (e.g., a touch thereon) provided to the display apparatus 1000.

In an embodiment, the input sensing layer 300 may sense an external input which is input through a portion of a body of a user. In an embodiment of the invention, the external input is not limited to a certain type. According to an embodiment of the invention, the external input may be input in an optical, contact, or magnetic manner.

Although not illustrated in the drawings, the input sensing layer 300 may include a plurality of input sensing electrodes (not shown) for sensing an external input.

The input sensing layer 300 may sense an external input using at least one of various methods. In an embodiment, the input sensing layer 300 may be driven in a capacitive, resistive, or coordinate recognition manner.

The reflection preventive layer 400 is disposed on the input sensing layer 300. The reflection preventive layer 400 is disposed overlapping the display area DA of the display module DM in a plan view or when viewed from a plan view in the third direction DR3. The reflection preventive layer 400 effectively prevents external light incident to the display apparatus 1000 from being reflected from the display module DM and viewed by a user. Although not illustrated in the drawings, the reflection preventive layer 400 may include a polarization layer (not shown) and a phase delay layer (not shown).

In an embodiment, the polarization layer (not shown) has a transmission axis and an absorption axis perpendicular to the transmission axis. One component among components of the external light incident to the polarization layer (not shown) is absorbed by the absorption axis or reflected and is thus unable to pass through the polarization layer (not shown), but a component perpendicular to the one component among the external light incident to the polarization layer (not shown) passes through the polarization layer (not shown). In such an embodiment, the polarization layer (not shown) linearly polarizes the external light.

In an embodiment, the polarization layer (not shown) may include or be composed of polymer resin stretched in a specific direction. However, the type of the polarization layer (not shown) of an embodiment of the invention is not limited thereto. In an alternative embodiment of the invention, the polarization layer (not shown) may be a wire grid polarizer.

The phase delay layer (not shown) is disposed under the polarization layer (not shown). The phase delay layer (not shown) has optical anisotropy. Therefore, the phase delay layer (not shown) may delay a phase of one component of light. That is, the phase delay layer (not shown) serves to change a polarization state of light. In an embodiment, the phase delay layer (not shown) may delay one component of light by λ/4. In such an embodiment, the phase delay layer (not shown) may be a quarter wave film. Therefore, the phase of one component of light that passes through the phase delay layer (not shown) may be delayed so that the light may be changed from a linear polarization state to a circular polarization state or vice versa.

According to an embodiment, even though the external light incident to the display apparatus 1000 is reflected by the display module DM, the light may be absorbed or reflected by the polarization layer (not shown) since the polarization state is changed by the phase delay layer (not shown). In such an embodiment, the external light reflected by the display module DM may not be viewed outside the display apparatus 1000.

In an embodiment, the window member 500 is disposed on the reflection preventive layer 400. The window member 500 provides a front surface of the display apparatus 1000, and protects the reflection preventive layer 400, the input sensing layer 300, and the display module DM. In one embodiment, for example, the window member 500 may include a glass substrate, a sapphire substrate, or a plastic film. The window member 500 may have a single-layer or multi-layer structure. In one embodiment, for example, the window member 500 may have a structure in which a plurality of plastic films bonded by an adhesive are laminated or a structure in which an organic substrate and a plastic film bonded by an adhesive are laminated.

In an embodiment, the display apparatus 1000 may further include a plurality of adhesive members AD1 and AD2. The first adhesive member AD1 is disposed between the input sensing layer 300 and the reflection preventive layer 400 to bond the input sensing layer 300 and the reflection preventive layer 400 to each other. The second adhesive member AD2 is disposed between the reflection preventive layer 400 and the window member 500 to bond the reflection preventive layer 400 and the window member 500 to each other.

In an alternative embodiment of the invention, the input sensing layer 300, the reflection preventive layer 400 or the window member 500 may be omitted.

Figure 3:
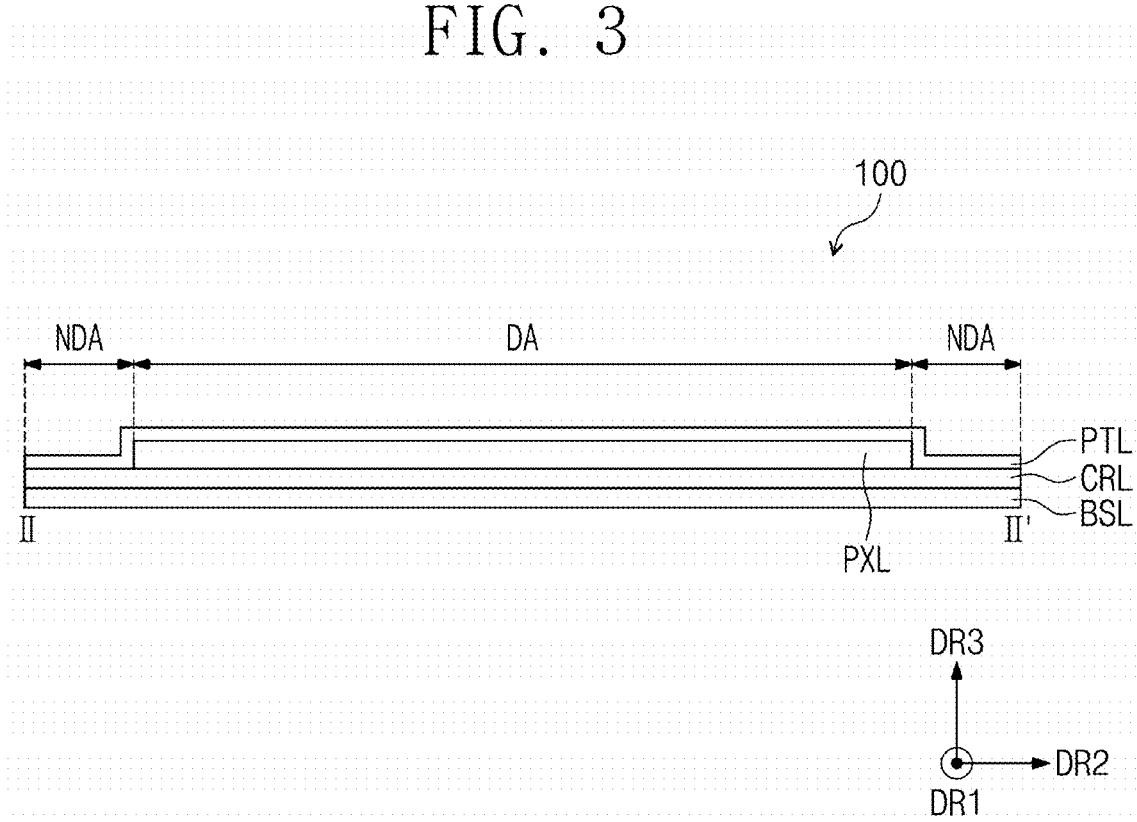
FIG. 3 is an enlarged cross-sectional view of the display panel illustrated in FIG. 2.

FIG. 3 is an enlarged cross-sectional view of the display panel illustrated in FIG. 2. FIG. 3 may be a cross-sectional view of the display panel 100 taken along line II-II' of FIG. 1.

Figure 4:
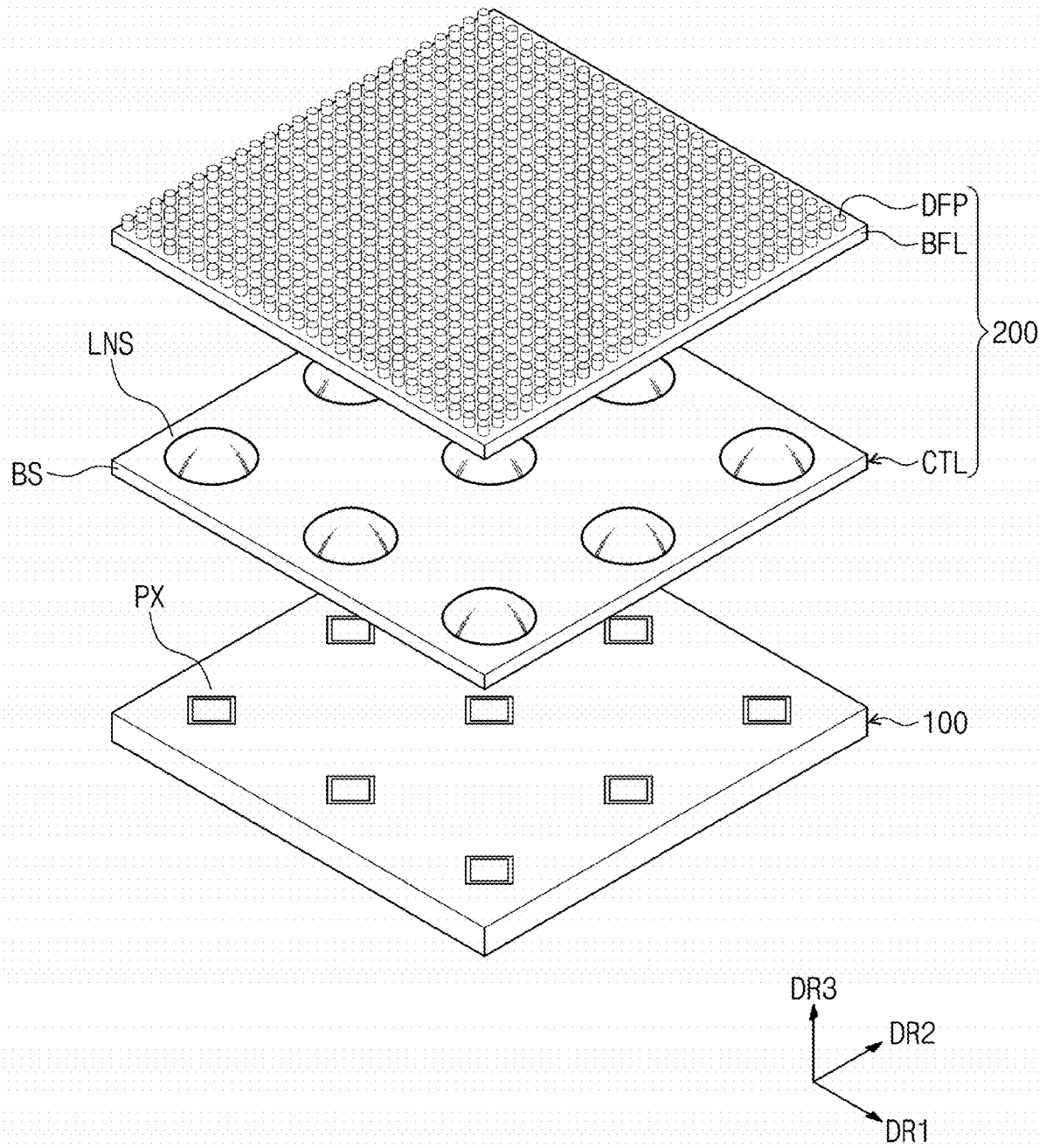
FIG. 4 is an exploded perspective view of the display module illustrated in FIG. 2.

FIG. 4 is an exploded perspective view of the display module illustrated in FIG. 2.

For ease of description, FIG. 4 illustrates an enlarged view of one portion of the display panel 100 and the optical member 200 corresponding to the display area DA illustrated in FIG. 2.

Referring to FIGS. 3 and 4, an embodiment of the display panel 100 may be an organic light-emitting display panel. In such an embodiment, the display device included in the display panel 100 may be an organic light-emitting device ("OLED").

In such an embodiment, as shown in FIG. 3, the display panel 100 includes a base layer BSL, a circuit layer CRL, a pixel layer PXL, and a protective layer PTL. The base layer BSL defines a rear surface of the display panel 100. The circuit layer CRL is disposed on the base layer BSL. The circuit layer CRL may include a plurality of thin-film transistors (not shown) and a plurality of signal wires (not shown) for driving a plurality of organic light-emitting devices OLEDs (FIGS. 5 and 6) described below.

Figure 5:
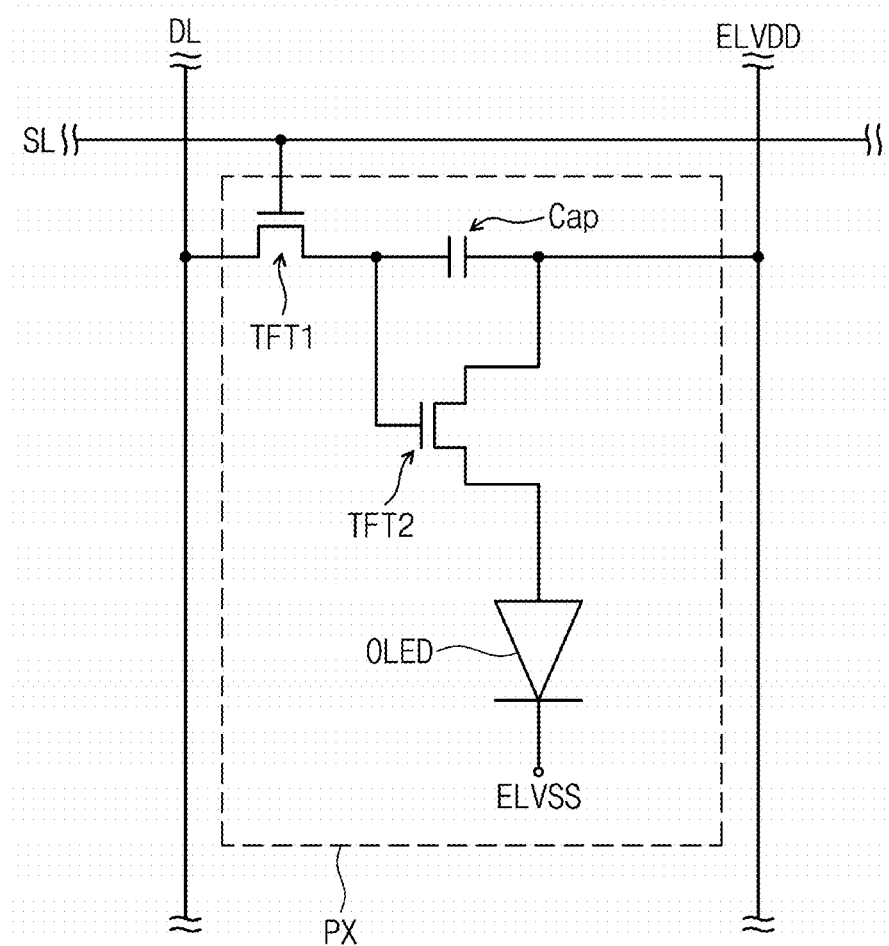
FIG. 5 is an equivalent circuit of a pixel illustrated in FIG. 4.
Figure 6:
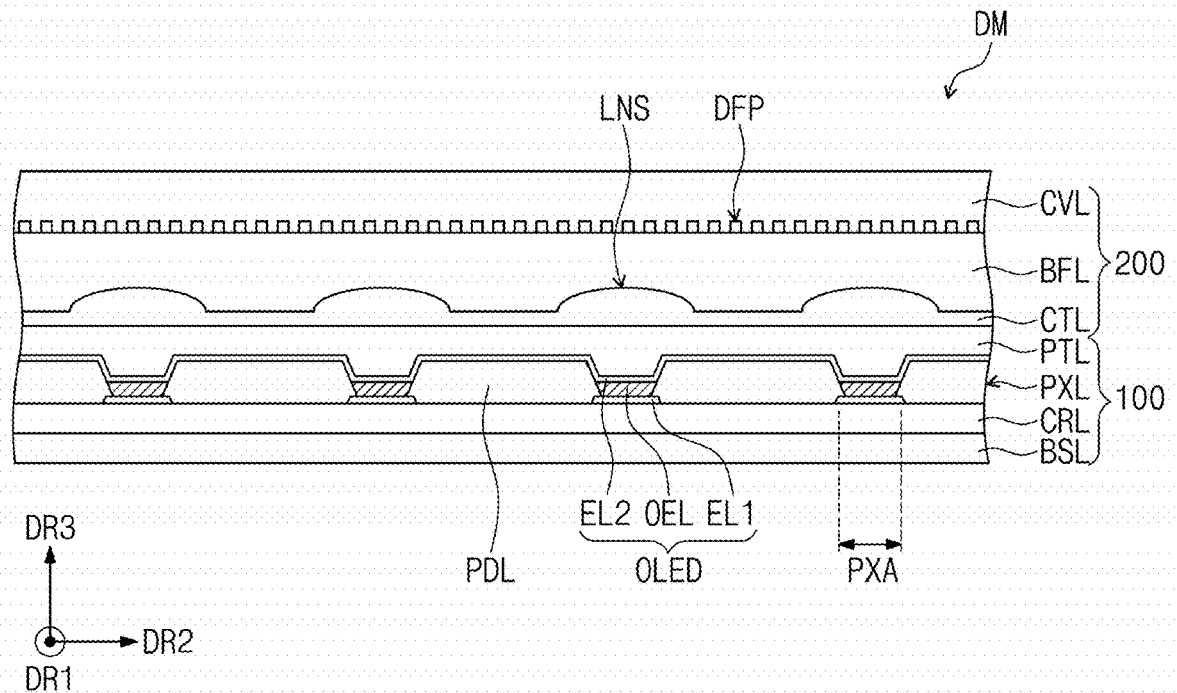
FIG. 6 is an enlarged cross-sectional view of the display module illustrated in FIG. 4.

The pixel layer PXL is disposed on the circuit layer CRL. The pixel layer PXL includes a plurality of OLEDs (FIGS. 5 and 6) and a pixel defining layer PDL partitioning the OLEDs (FIGS. 5 and 6). One OLED (FIGS. 5 and 6) of the pixel layer PXL and at least one thin-film transistor (not shown) of the circuit layer CRL connected to the OLED (FIGS. 5 and 6) may define one pixel PX. In such an embodiment, the display panel 100 includes a plurality of pixels PX.

According to an embodiment of the invention, the type of the display panel 100 may be determined according to a configuration of the pixel layer PXL. The display panel 100 may be an organic light-emitting display panel, a liquid crystal display panel, an electrophoretic display panel, or an electrowetting display panel, or any one of various display panels for displaying images. In an embodiment, the display panel 100 may be variously modified without being limited to one embodiment. In the figures (except for FIG. 18) described below, embodiments where the display panel 100 is an organic light-emitting display panel are shown for convenience of illustration and description.

In an embodiment, the protective layer PTL is disposed on the pixel layer PXL to cover the pixel layer PXL. The protective layer PTL may be an encapsulation layer for encapsulating the pixel layer PXL. In an embodiment, the protective layer PTL has a first refractive index. In one embodiment, for example, the first refractive index may be in a range from about 1.4 to about 1.6.

In an embodiment of the invention, the protective layer PTL may include a plurality of laminated organic films and/or inorganic films. In an embodiment, the protective layer PTL may be a planarization layer for planarizing an upper surface of the pixel layer PXL. The protective layer PTL may be modified in various forms, and is not limited to one embodiment.

FIG. 5 is an equivalent circuit of a pixel illustrated in FIG. 4.

Referring to FIG. 5, a pixel PX includes a thin-film transistor, a capacitor, and a display device. In an embodiment, the pixel PX includes a first thin-film transistor TFT1, a second thin-film transistor TFT2, a single capacitor Cap, and an organic light-emitting device OLED.

The first thin-film transistor TFT1 includes a control electrode connected to a scan line SL, an input electrode connected to a data line DL, and an output electrode. The first thin-film transistor TFT1 outputs a data signal applied thereto through the data line DL in response to a scan signal applied thereto through the scan line SL.

The capacitor Cap includes a first capacitor electrode connected to the output electrode of the first thin-film transistor TFT1 and a second capacitor electrode for receiving a first power supply voltage ELVDD. The capacitor Cap is charged with charges, the amount of which corresponds to the difference between the first power supply voltage ELVDD and a voltage corresponding to the data signal received from the first thin-film transistor TFT1.

The second thin-film transistor TFT2 includes a control electrode connected to the output electrode of the first thin-film transistor TFT1 and the first capacitor electrode of the capacitor Cap, an input electrode for receiving the first power supply voltage ELVDD, and an output electrode. The output electrode of the second thin-film transistor TFT2 is connected to the OLED.

The second thin-film transistor TFT2 controls a driving current that flows through the OLED based on the charge stored in the capacitor Cap. A turn-on time of the second thin-film transistor TFT2 is determined based on the amount of the charge stored in the capacitor Cap. The output electrode of the second thin-film transistor TFT2 substantially supplies, to the OLED, a voltage lower than the first power supply voltage ELVDD.

The OLED includes a first electrode connected to the second thin-film transistor TFT2 and a second electrode connected to a second power supply voltage ELVSS. The OLED may include a light-emitting pattern or layer disposed between the first electrode and the second electrode.

The OLED emits light during a turn-on period of the second thin-film transistor TFT2. A color of light generated by the OLED is determined by a material included in or forming the light-emitting pattern or layer. In one embodiment, for example, the color of light generated by the OLED may be one of a red color, a green color, a blue color, and white. The OLED substantially defines a light-emitting area PXA on the display panel 100.

Referring back to FIG. 4, the optical member 200 includes a light concentration layer CTL, a buffer layer BFL, and a plurality of diffraction patterns DFP.

The light concentration layer CTL is disposed on the display panel 100. The light concentration layer CTL includes a bottom layer BS and a plurality of light concentration lenses LNS disposed on the bottom layer BS. The bottom layer BS and the plurality of light concentration lenses LNS may be integrally formed with each other as a single unit. According to an embodiment, the light concentration layer CTL has a second refractive index. In one embodiment, for example, the second refractive index may be in a range from about 1.7 to about 1.9.

The bottom layer BS overlaps the display area DA of the display module DM. The bottom layer BS may contact an upper surface of the display panel 100. In an embodiment, the bottom layer BS contact the protective layer PTL (FIG. 3) of the display panel 100.

The plurality of light concentration lenses LNS are arranged on an upper surface of the bottom layer BS. The plurality of light concentration lenses LNS have a shape protruding upwardly or in the third direction DR3 from the upper surface of the bottom layer BS.

In an embodiment, each of the light concentration lenses LNS may have a predetermined radius of curvature. In one embodiment, for example, the radius of curvature of each of the light concentration lenses LNS may be in a range from about 7 μmicrometers (μm) to about 14 μm.

The plurality of light concentration lenses LNS are spaced apart from each other. In an embodiment, the light concentration lenses LNS are arranged in a one-to-one correspondence with the pixels PX arranged in the display panel 100. In an embodiment, each of the light concentration lenses LNS may overlap at least a portion of a corresponding pixel of the pixels PX in a plan view or when viewed from a plan view in the third direction DR3. In one embodiment, for example, each of the light concentration lenses LNS may be arranged overlapping the OLED included in the corresponding pixel PX in a plan view.

The buffer layer BFL is disposed on the light concentration layer CTL to cover the light concentration layer CTL. In an embodiment, the buffer layer BFL has a third refractive index. In one embodiment, for example, the third refractive index may be in a range from about 1.4 to about 1.6. In an embodiment, the buffer layer BFL may include an acryl or siloxane-based material. The buffer layer BFL may be formed on the light concentration layer CTL through a coating process. However, the material or manufacturing process of the buffer layer BFL of an embodiment of the invention is not particularly limited.

The diffraction patterns DFP are arranged on the buffer layer BFL. The diffraction patterns DFP may be arranged in a matrix form on an upper surface of the buffer layer BFL. The diffraction patterns DFP serve to diffract at least a portion of incident light. The diffraction patterns DFP have the third refractive index. In one embodiment, for example, the third refractive index may be in a range from about 1.4 to about 1.6. The diffraction patterns DFP will be described later in greater detail with reference to FIGS. 7 to 11.

Referring to FIGS. 2 and 4, in an embodiment, the optical member 200 may further include a cover layer CVL disposed on the diffraction patterns DFP. The cover layer CVL covers the diffraction patterns DFP. In such an embodiment, the cover layer CVL may perform a planarization function or provide a flat surface on the diffraction patterns DFP disposed therebelow.

FIG. 6 is an enlarged cross-sectional view of the display module illustrated in FIG. 4.

Referring to FIG. 6, the pixel layer PXL includes the OLEDs and the pixel defining layer PDL as described above.

The OLED includes a first electrode EL1, a second electrode EL2, and a light emission layer OEL. The first electrode EL1 may be a pixel electrode or a positive electrode. The first electrode EL1 may be a transflective or reflective electrode. In an embodiment, the first electrode EL1 may include Ag, Mg, Al, Pt, Pd, Au, Ni, Nd, Ir, Cr, or a combination thereof. Alternatively, the first electrode EL1 may have a multi-layer structure including: a reflective film or a transflective film including the above-mentioned material; and a transparent conductive film including indium tin oxide ("ITO"), indium zinc oxide ("IZO"), zinc oxide (ZnO), indium tin zinc oxide ("ITZO"), or the like.

The second electrode EL2 may be a common electrode or negative electrode. The second electrode EL2 may be a transmissive electrode. In an embodiment, the second electrode EL2 may include Li, Ca, LiF/Ca, LiF/Al, Al, Mg, BaF, Ba, Ag metal or a compound or mixture thereof (e.g., mixture of Ag and Mg). However, an embodiment of the invention is not limited thereto. In one alternative embodiment, for example, the second electrode EL2 may include ITO, IZO, zinc oxide (ZnO), or ITZO.

The pixel defining layer PDL may be disposed on the first electrode EL1. In an embodiment, the pixel defining layer PDL may cover a portion of the first electrode EL1 and may expose the other portion of the first electrode EL1. The pixel defining layer PDL may include a metal-fluorine ion compound, but an embodiment of the invention is not limited thereto. In one embodiment, for example, the pixel defining layer PDL may include any one of metal-fluorine ion compound among LiF, $BaF_2$, and CsF. When a metal-fluorine ion compound has a predetermined thickness, the metal-fluorine ion compound has an insulating characteristic. Light-emitting areas PXA may be defined by the pixel defining layer PDL. The light concentration lenses LNS of the light concentration layer CTL may overlap the light-emitting area PXA in a plan view.

The light emission layer OEL may be disposed between the first electrode EL1 and the second electrode EL2. In an embodiment, the light emission layer OEL may be disposed in the light-emitting area PXA defined by the pixel defining layer PDL.

According to an embodiment of the invention, an area occupied by each of the light concentration lenses LNS in a plan view may be larger than an area occupied by each OLED in a plan view. In such an embodiment, the area occupied by each of the light concentration lenses LNS in a plan view may be larger than an area occupied by each of the light-emitting areas PXA.

In an embodiment, a plurality of common layers may be disposed between the first electrode EL1 and the second electrode EL2 in addition to the light emission layer OEL. In such an embodiment, a hole injection layer, a hole transport layer, a light emission layer, an electron transport layer and an electron injection layer may be sequentially laminated between the first electrode EL1 and the second electrode EL2. In an embodiment, at least one of a hole blocking layer, a hole buffer layer and an electron blocking layer may be disposed between the first electrode EL1 and the second electrode EL2.

Figure 7:
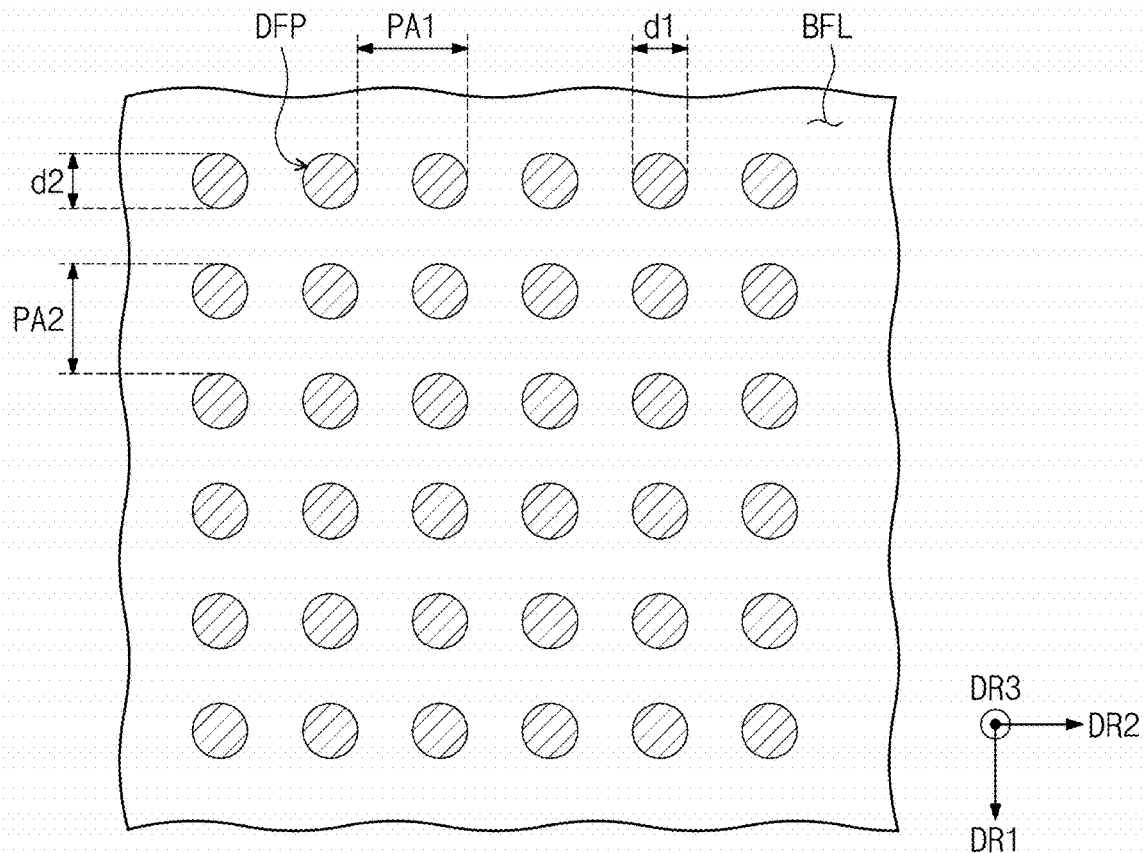
FIG. 7 is a plan view illustrating a diffraction pattern according to an embodiment of the invention.

FIG. 7 is a plan view illustrating a diffraction pattern according to an embodiment of the invention.

Referring to FIG. 7, the diffraction patterns DFP are arranged on the buffer layer BFL. Each of the diffraction patterns DFP has a circular shape on a plane defined by the first direction DR1 and the second direction DR2. In one embodiment, for example, diameters d1 and d2 of each of the diffraction patterns DFP may be in a range from about 2.5 μm to about 5.0 μm. However, the shape and diameter of each of the diffraction patterns DFP of an embodiment of the invention are not particularly limited.

The diffraction patterns DFP are arranged in a matrix form having a plurality of rows in the first direction DR1 and a plurality of columns in the second direction DR2. The diffraction patterns DFP are arranged at regular (or constant) intervals PA1 and PA2 in the first direction DR1 and in the second direction DR2. In an embodiment, the diffraction patterns DFP have a first interval PAT in the first direction DR1 and a second interval PA2 in the second direction DR2. In the embodiment, the first interval PA1 may be the same as the second interval PA2. In one embodiment, for example, each of the first interval PAT and the second interval PA2 may be in a range from about 4.5 μm to about 7.5 μm.

In an embodiment, the diffraction patterns DFP may diffract at least a portion of incident light. In an embodiment, the first interval PAT and the second interval PA2 may be differently designed according to a wavelength λ of light to be diffracted by the diffraction patterns DFP. In one embodiment, for example, each of the first interval PAT and the second interval PA2 may be equal to $\lambda/n \times \sin\theta$, where n denotes a refractive index difference between the diffraction pattern DFP and the cover layer CVL (FIG. 2), and θ denotes an angle formed by light incident from the buffer layer BFL to the diffraction pattern DFP with respect to the third direction DR3.

In an alternative embodiment of the invention, the first interval PAT may be different from the second interval PA2.

The diffraction patterns DFP will hereinafter be described in greater detail with reference to FIGS. 8 and 9.

Figure 8:
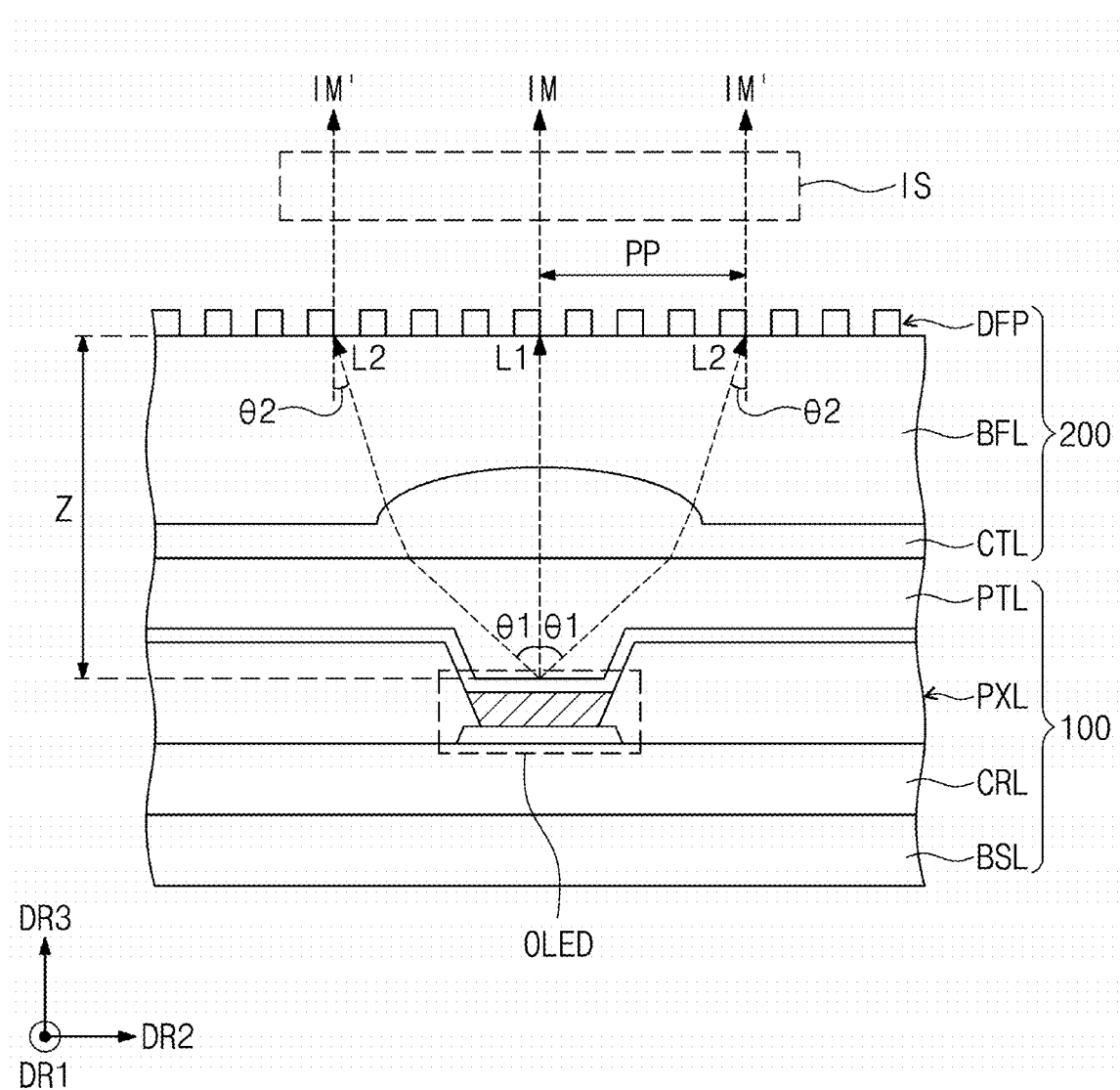
FIG. 8 is a diagram schematically illustrating a light path of light generated by an organic light-emitting device according to an embodiment of the invention.
Figure 9:
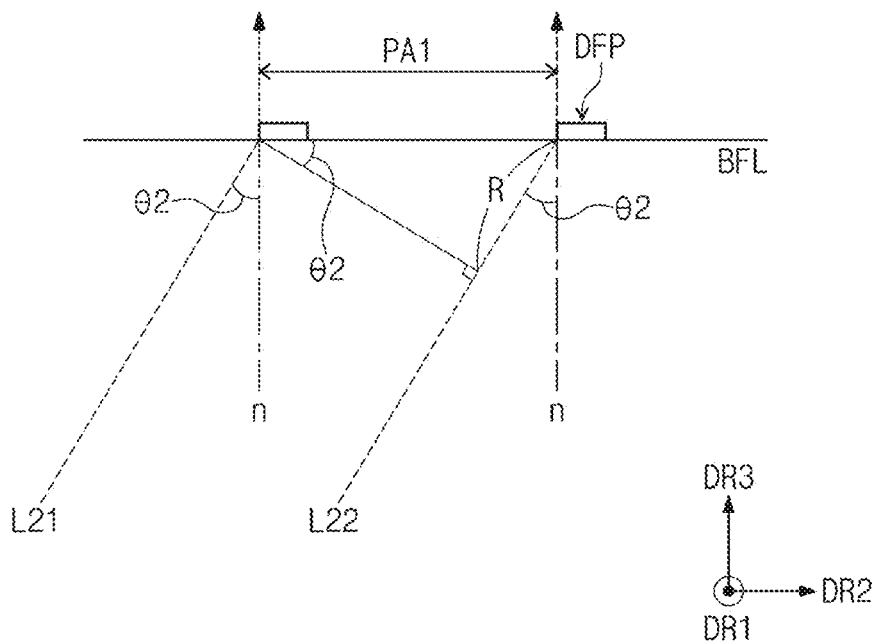
FIG. 9 is a diagram schematically illustrating diffraction of second light illustrated in FIG. 8.

FIG. 8 is a diagram schematically illustrating a light path of light generated by an organic light-emitting device according to an embodiment of the invention, and FIG. 9 is a diagram schematically illustrating diffraction of second light illustrated in FIG. 8. For ease of description, FIGS. 8 and 9 only illustrate one cross section of the display module DM taken along a line parallel with the second direction DR2. However, according to an embodiment of the invention, the configuration of the display module DM described below has the same configuration as the configuration of the cross section of the display module DM taken along a line parallel with the first direction DR1.

Referring to FIGS. 8 and 9, in an embodiment, the OLED generates lights. Among the lights generated by the OLED, the light that travels upwardly along the third direction DR3 perpendicular to the display surface IS is defined as a first light L1. The first light L1 passes through the protective layer PTL, the light concentration layer CTL, the buffer layer BFL, and the diffraction pattern DFP to display a pixel unit image IM on the display surface IS.

The lights generated by the OLED, other than the first light L1, are defined as side lights (not shown). For ease of description, FIG. 8 only illustrates second lights L2 defined as lights which are emitted from the OLED in a direction forming a first angle θ1 with the first light L1.

The second lights L2 pass through the protective layer PTL in the direction forming the first angle θ1 with the first light L1. The second lights L2 may be primarily refracted at an interface between the protective layer PTL and the light concentration layer CTL due to a refractive index difference between the protective layer PTL and the light concentration layer CTL. In such an embodiment, an intermediate refraction angle (not shown) defined as an angle formed by each of the second lights L2 primarily refracted at the interface with respect to the first light L1 is smaller than the first angle θ1.

Each of the second lights L2 incident to the light concentration layer CTL at the intermediate refraction angle may be secondarily refracted at an upper surface of the light concentration lens LNS of the light concentration layer CTL. Each of the secondarily refracted second lights L2 may form a second angle θ2 with the first light L1. The second angle θ2 is smaller than the intermediate refraction angle. In an embodiment, the value of the second angle θ2 may vary according to the shape of the upper surface of the light concentration lens LNS.

The second lights L2 refracted at the second angle θ2 are incident to the buffer layer BFL. The second lights L2 are incident to the diffraction pattern DFP after passing through the buffer layer BFL, and the incident second lights L2 may be diffracted by the diffraction patterns DFP.

According to an embodiment of the invention, the diffraction patterns DFP having the regular interval PA1 and PA2 may diffract the first light L1 among incident lights and the second light L2 incident at the second angle θ2 to display a replication unit image IM' on the display surface IS. In such an embodiment, the second light L2 may be incident to the diffraction patterns DFP at the second angle θ2 for displaying the replication unit image IM'.

According to the embodiment, the second light L2 emitted from the OLED at the first angle θ1 with respect to the first light L1 is transmitted and refracted by intermediate members, and is incident to the diffraction patterns DFP at the second angle θ2 with respect to the first light L1. In an embodiment, the intermediate members include the protective layer PTL, the light concentration layer CTL, and the buffer layer BFL.

In an embodiment, a distance from an upper surface of the OLED to an upper surface of the buffer layer BFL, on which the diffraction patterns DFP are arranged, may be defined as an optical distance Z. In such an embodiment, the optical distance Z may be in a range from about 50 μm to about 150 μm.

In an embodiment, as described above, the diffraction patterns DFP diffract the second light L2 to display the replication unit images IM' on the display surface IS.

In such an embodiment, the second light L2 includes a first sub-light L21 and a second sub-light L22. The first sub-light L21 and the second sub-light L22 forming the second angle θ2 with respect to the first light L1 are incident to different diffraction patterns DFP. An optical path difference may be generated between the first sub-light L21 and the second sub-light L22, where the optical path difference is defined as a first distance.

According to an embodiment, the first sub-light L21 and the second sub-light L22 may undergo constructively interference with each other since the first sub-light L21 and the second sub-light L22 are diffracted by the diffraction patterns DFP. In such an embodiment, a phase difference may be generated between the first sub-light L21 and the second sub-light L22, where the phase difference may be the same as the wavelength λ of the second light L2. Therefore, the first distance is proportional to the wavelength λ of the second light L2. The first sub-light L21 and the second sub-light L22, which have undergone constructively interference with each other, display the replication unit image IM' on the display surface IS.

Figure 10:
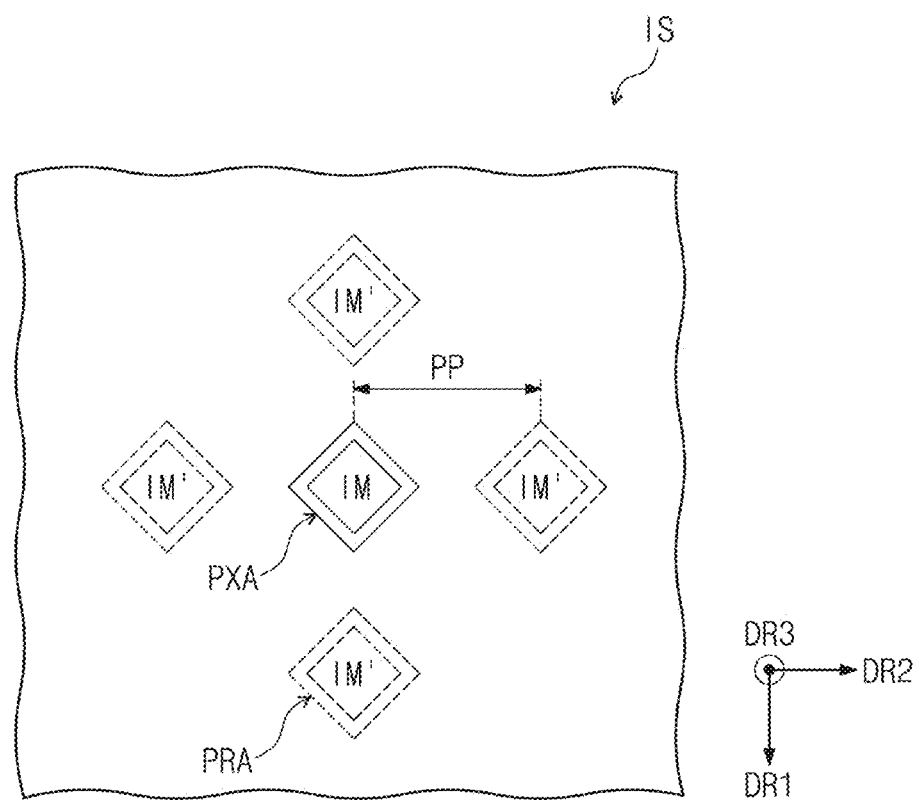
FIG. 10 is a front view of replication unit images displayed on a display surface by diffracted light.

FIG. 10 is a front view of replication unit images displayed on a display surface by diffracted light. For ease of description, FIG. 10 only illustrates one light-emitting area PXA among the plurality of light-emitting areas PXA.

Referring to FIG. 10, in an embodiment, the display surface IS includes the plurality of light-emitting areas PXA and a plurality of replication areas PRA. The plurality of replication areas PRA area arranged around one light-emitting areas PXA. In such an embodiment, the replication areas PRA may be defined at opposing sides of one light-emitting area PXA in the first direction DR1 and other opposing sides of the light-emitting area PXA in the second direction DR2. The shape of each of the light-emitting areas PXA may be the same as the shape of each of the replication areas PRA. FIG. 10 illustrates the light-emitting areas PXA and the replication areas PRA as having a rhombus shape, but an embodiment of the invention is not limited thereto.

The light-emitting areas PXA and the replication areas PRA are spaced apart from each other. An interval between one light-emitting area PXA and one replication area PRA adjacent thereto is defined as a replication interval PP. In one embodiment, for example, the replication interval PP may be about 25 μm or less. The replication interval PP is a distance between a center of the one light-emitting area PXA and a center of the one replication area PRA.

According to an embodiment, the first light L1 among the lights generated by the OLED passes through the intermediate members PTL, CTL, and BFL and displays the pixel unit image IM in the light-emitting area PXA of the display surface IS. The shape of the pixel unit image IM corresponds to a planar shape of the OLED. In such an embodiment, the second lights L2 among the lights generated by the OLED pass through the intermediate members PTL, CTL, and BFL and displays the replication unit image IM' in the replication area PRA of the display surface IS. The shape of the replication unit image IM' corresponds to the shape of the pixel unit image IM. An image displayed by the display module DM may be provided to a user in a combined form of the pixel unit images IM and the replication unit images IM'.

According to an embodiment of the invention, the plurality of unit images IM and IM' may be displayed on the display surface IS using light generated by one OLED. In such an embodiment, a unit image provided from one OLED may be replicated as a plurality of images. In such an embodiment, since the replication area PRA, on which separate unit images are displayed, are defined in a non-light-emitting area (not shown) defined between the light-emitting areas PXA on a conventional display surface IS, the non-light-emitting area (not shown) may be prevented from being viewed from an outside. Accordingly, in such an embodiment, a display quality of the display apparatus 1000 may be improved.

Figure 11:
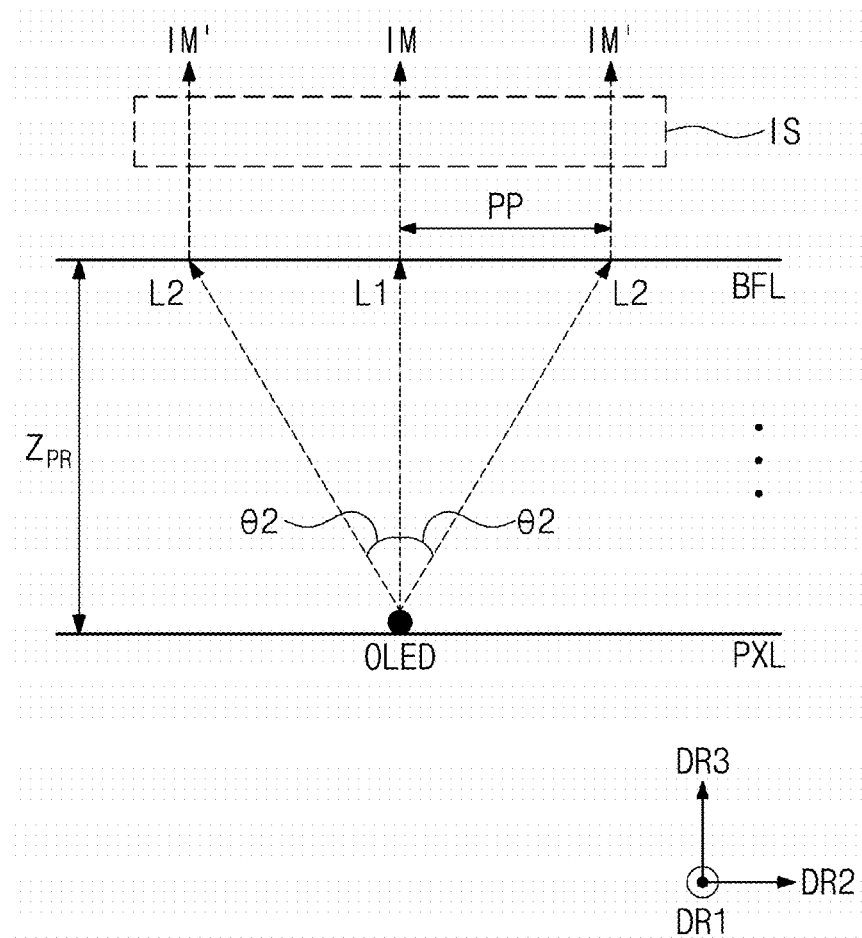
FIG. 11 is a diagram schematically illustrating light paths of lights for forming replication unit images as a comparative example.

FIG. 11 is a diagram schematically illustrating light paths of lights for forming replication unit images as a comparative example.

Referring to FIG. 11, unlike the embodiment of the invention, in a comparative example, where the display module DM does not include the light concentration layer CTL, i.e., where light among the lights emitted from the OLED is incident to the buffer layer BFL at the second angle θ2 with respect to the first light L1 without being secondarily refracted, the optical distance $Z_{PR}$ from the upper surface of the OLED to the upper surface of the buffer layer BFL, on which the diffraction patterns DFP are arranged, may increase. In the comparative example, where the display module DM does not include the light concentration layer CTL, the optical distance $Z_{PR}$ may be at least about 150 μm. When the optical distance $Z_{PR}$ is more than 150 μm, contraction may occur due to heat or moisture, and thus a bending pressure may be applied to the display module DM. However, according to an embodiment of the invention, the second light L2 is secondarily refracted by the light concentration layer CTL, and thus the optical distance Z may reduce. As a result, according to an embodiment of the invention, a thickness of the display apparatus 1000 may reduce, and durability thereof may be improved.

Figure 12:
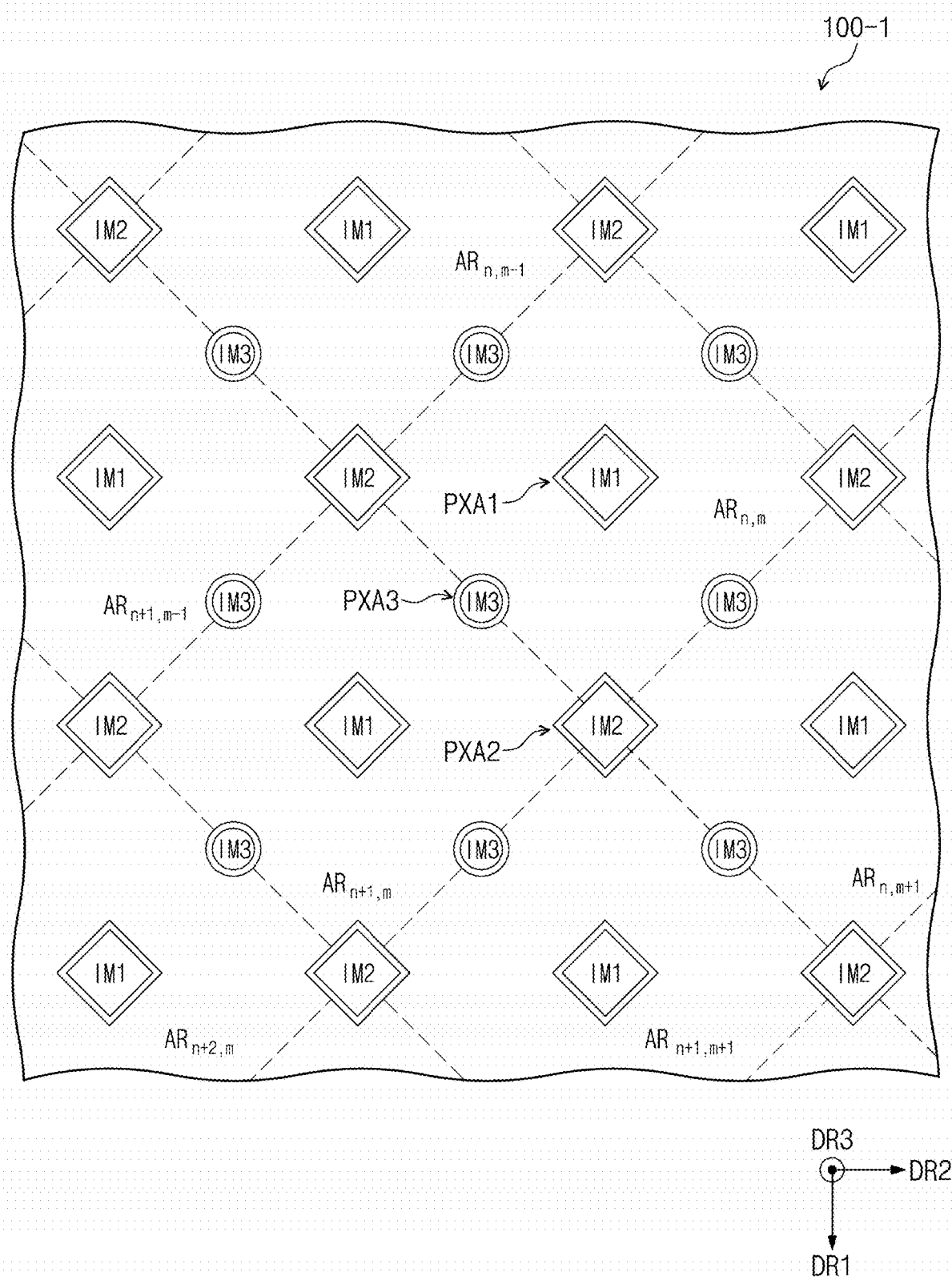
FIG. 12 is a front view of a display panel according to an alternative embodiment of the invention.
Figure 13:
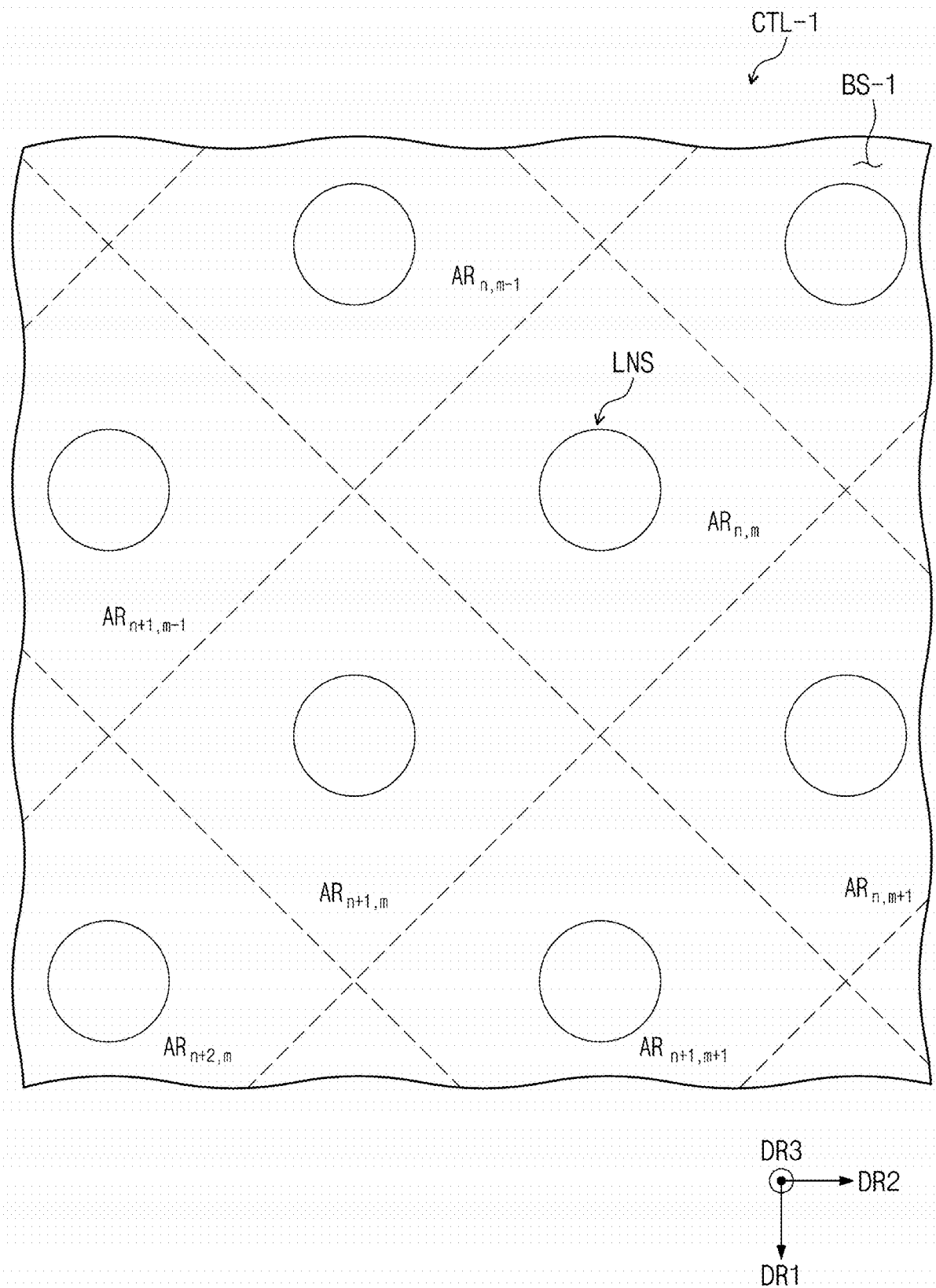
FIG. 13 is a front view of a light concentration layer disposed on the display panel illustrated in FIG. 12.
Figure 14:
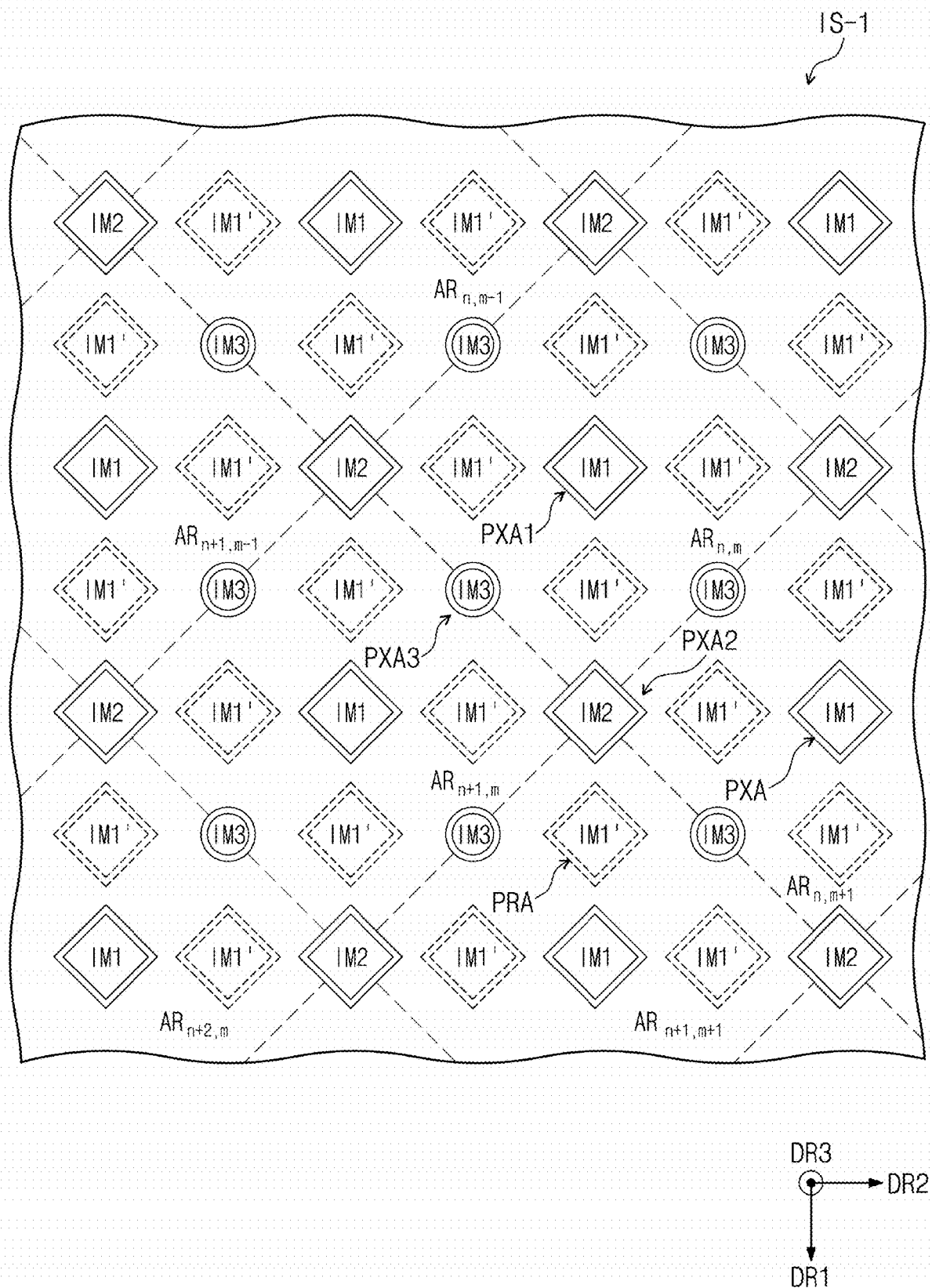
FIG. 14 is a front view of replication unit images displayed on a display surface by light generated by the display panel illustrated in FIG. 12.

FIG. 12 is a front view of a display panel according to an alternative embodiment of the invention, and FIG. 13 is a front view of a light concentration layer disposed on the display panel illustrated in FIG. 12. FIG. 14 is a front view of replication unit images displayed on a display surface by light generated by the display panel illustrated in FIG. 12.

For ease of description, the following descriptions are focused on elements different from those in the embodiments described above. The same or like elements have been labeled with the same reference characters as used above to describe the embodiments above, and any repetitive detailed description thereof will hereinafter be omitted or simplified.

Referring to FIGS. 12 to 14, a display panel 100-1 according to an embodiment includes a plurality of pixels (not shown) for emitting different lights in a plan view. The lights emitted from the plurality of pixels (not shown) display a plurality of pixel unit images IM1, IM2 and IM3 on a display surface IS-1 described below.

Each of the organic light-emitting devices (not shown) included in the plurality of pixels (not shown) defines a light-emitting area PXA1, PXA2, and PXA3 on the display panel 100-1.

In an embodiment, the display panel 100-1 defines a plurality of panel areas AR in a plan view. The plurality of panel areas AR have the same shape and are arranged adjacent to each other. In an embodiment, each of the panel areas AR has a rhombus shape.

The light-emitting areas PXA1, PXA2, and PXA3 are arranged on the panel areas AR. The light-emitting areas PXA1, PXA2, and PXA3 may include first light-emitting areas PXA1 each of which displays a first pixel unit image IM1, second light-emitting areas PXA2 each of which displays a second pixel unit image IM2, and third light-emitting areas PXA3 each of which displays a third pixel unit image IM3.

Each of the first light-emitting areas PXA1 is defined at a center of each of panel areas (e.g., $AR_{n,m}$). The first pixel unit image IM1 displayed in each of the first light-emitting areas PXA1 is displayed by a first color light. In one embodiment, for example, the first color light may be a red light.

The second light-emitting areas PXA2 are defined in areas corresponding to vertices of each panel area $AR_{n,m}$. In an embodiment, the second light-emitting areas PXA2 are defined in vertex areas shared in common by four panel areas (e.g., $AR_{n,m}$, $AR_{n,m+1}$, $AR_{n+1,m-1}$, $AR_{n+1,m}$). Therefore, the first light-emitting areas PXA1 and the second light-emitting areas PXA2 may be alternately arranged along the first direction DR1 and along the second direction DR2. The second pixel unit image IM2 displayed in each of the second light-emitting areas PXA2 is displayed by a second color light. In one embodiment, for example, the second color light may be a blue light.

The third light-emitting areas PXA3 are defined at centers of sides shared in common by one panel area (e.g., $AR_{n+1,m}$) and panels areas (e.g., $AR_{n,m}$, $AR_{n+1,m-1}$, $AR_{n+1,m+1}$ or $AR_{n+2,m}$) adjacent thereto. The third pixel unit image IM3 displayed in each of the third light-emitting areas PXA3 is displayed by a third color light. In one embodiment, for example, the third color light may be a green light.

A light concentration layer CTL-1 is disposed on the display panel 100-1. A bottom layer BS-1 of the light concentration layer CTL-1 covers a front surface of the display panel 100-1. The light concentration lenses LNS are arranged on the bottom layer BS-1. According to an embodiment, the light concentration lenses LNS of the light concentration layer CTL-1 may be arranged in a one-to-one correspondence with the first light-emitting areas PXA1. In such an embodiment, as shown in FIG. 13, the light concentration lenses LNS are arranged overlapping the first light-emitting areas PXA1 and not overlapping the second and third light-emitting areas PXA2 and PXA3 in a plan view. In such an embodiment, each of the light concentration lenses LNS is arranged overlapping the center of each of the panel areas (e.g., $AR_{n,m}$).

Referring to FIG. 14, as described above, the diffraction patterns DFP (FIG. 7) diffract a specific light among incident lights to display the replication unit images IM1' on the display surface IS-1. In an embodiment, the plurality of replication areas PRA may be defined in areas adjacent to the first light-emitting areas PXA1 in which the pixel unit images IM1 are displayed by the first color light on the display surface IS-1. In such an embodiment, on the display surface IS-1, each of the replication areas PRA may be defined between the first light-emitting area PXA1 and the second light-emitting area PXA2 adjacent to each other. In an embodiment, a first replication unit image IM1' displayed by the first color light may be displayed in the replication areas PRA.

However, an embodiment of the invention is not limited thereto. In one alternative embodiment, for example, locations of the replication areas PRA and the colors of the replication unit images IM1' displayed in the replication areas PRA may vary according to a location of the light concentration layer CTL and arrangement intervals of the diffraction patterns DFP (FIG. 7).

Figure 15:
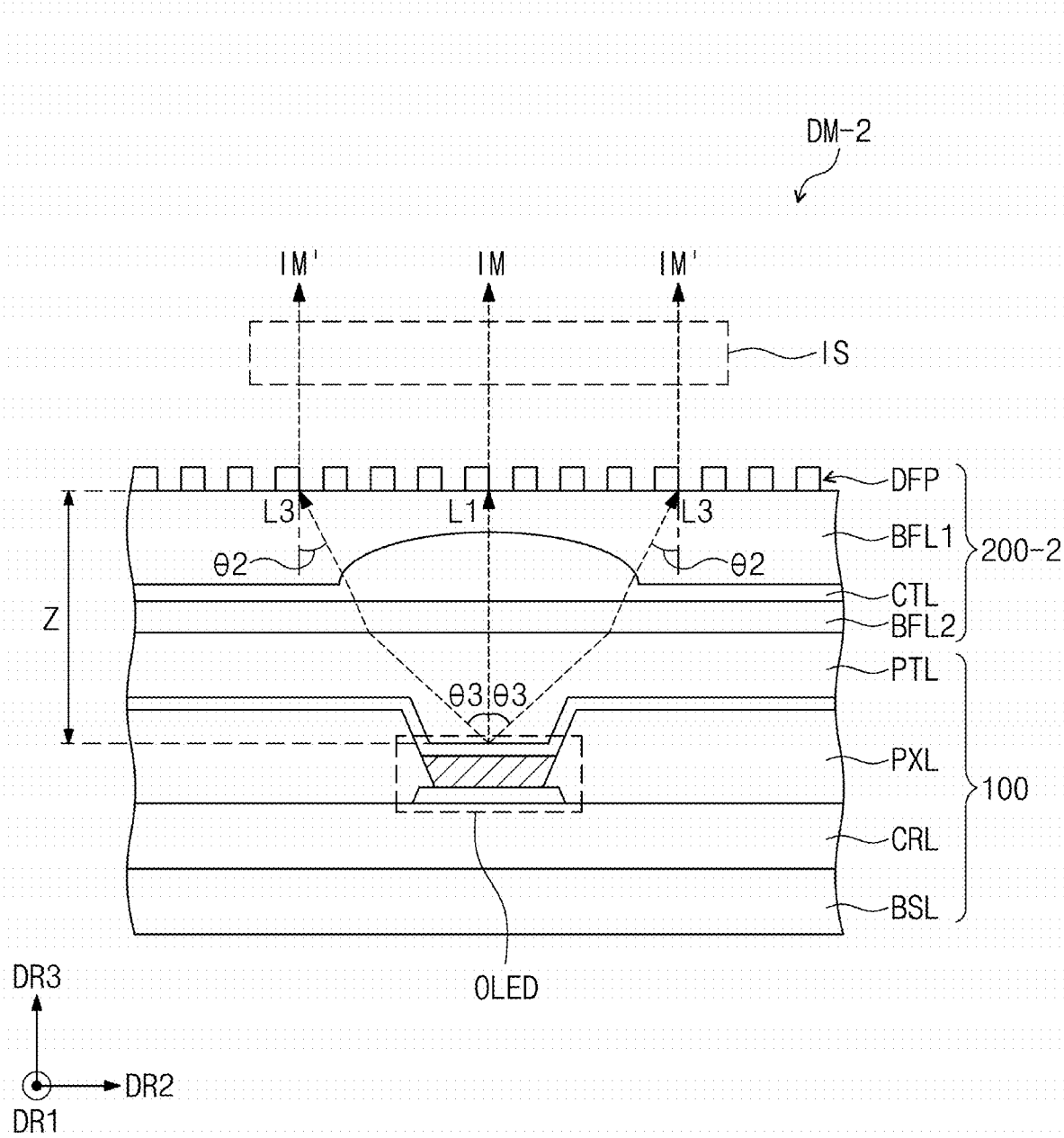
FIG. 15 is a cross-sectional view of a display module according to another embodiment of the invention.

FIG. 15 is a cross-sectional view of a display module according to another alternative embodiment of the invention.

For ease of description, the following descriptions are focused on elements different from those in the embodiments described above. The same or like elements have been labeled with the same reference characters as used above to describe the embodiments above, and any repetitive detailed description thereof will hereinafter be omitted or simplified.

Referring to FIG. 15, in an embodiment, an optical member 200-2 of a display module DM-2 includes a sub-buffer layer BFL2. In such an embodiment, a first buffer layer BFL1 has the same configuration as the above-mentioned buffer layer BFL (FIG. 2), and any repetitive detailed description thereof will be omitted.

The sub-buffer layer BFL2 is disposed between the protective layer PTL of the display panel 100 and the light concentration layer CTL. The sub-buffer layer BFL2 has a fourth refractive index. The fourth refractive index may be lower than the second refractive index. In one embodiment, for example, the fourth refractive index may range from about 1.4 to about 1.6.

According to the embodiment, a third light L3 among the lights emitted from the OLED forms a third angle θ3 with respect to the first light L1. The third angle θ3 is smaller than the first angle θ1 (FIG. 8). The third light L3 may be refracted at an interface between the protective layer PTL and the sub-buffer layer BFL2 due to a refractive index difference between the protective layer PTL and the sub-buffer layer BFL2. The refracted third light L3 is sequentially refracted at an interface between the sub-buffer layer BFL2 and the light concentration layer CTL and at an interface between the light concentration layer CTL and the first buffer layer BFL1, and is incident to the diffraction patterns DFP. The third light L3 forms the second angle θ2 with respect to the first light L1 in the first buffer layer BFL1 on which the diffraction patterns DFP are arranged.

According to the embodiment, since the sub-buffer layer BFL2 is disposed under the light concentration layer CTL, the side light may be refracted once more in comparison with the above embodiment. Therefore, the replication unit image IM' may be displayed using light emitted from the OLED at a relatively small angle with respect to the first light L1, i.e., light having a relatively small difference in intensity from the first light L1 which is a front light. That is, according to the embodiment, the intensity of the replication unit image IM' may increase in comparison with the above embodiment.

Figure 16:
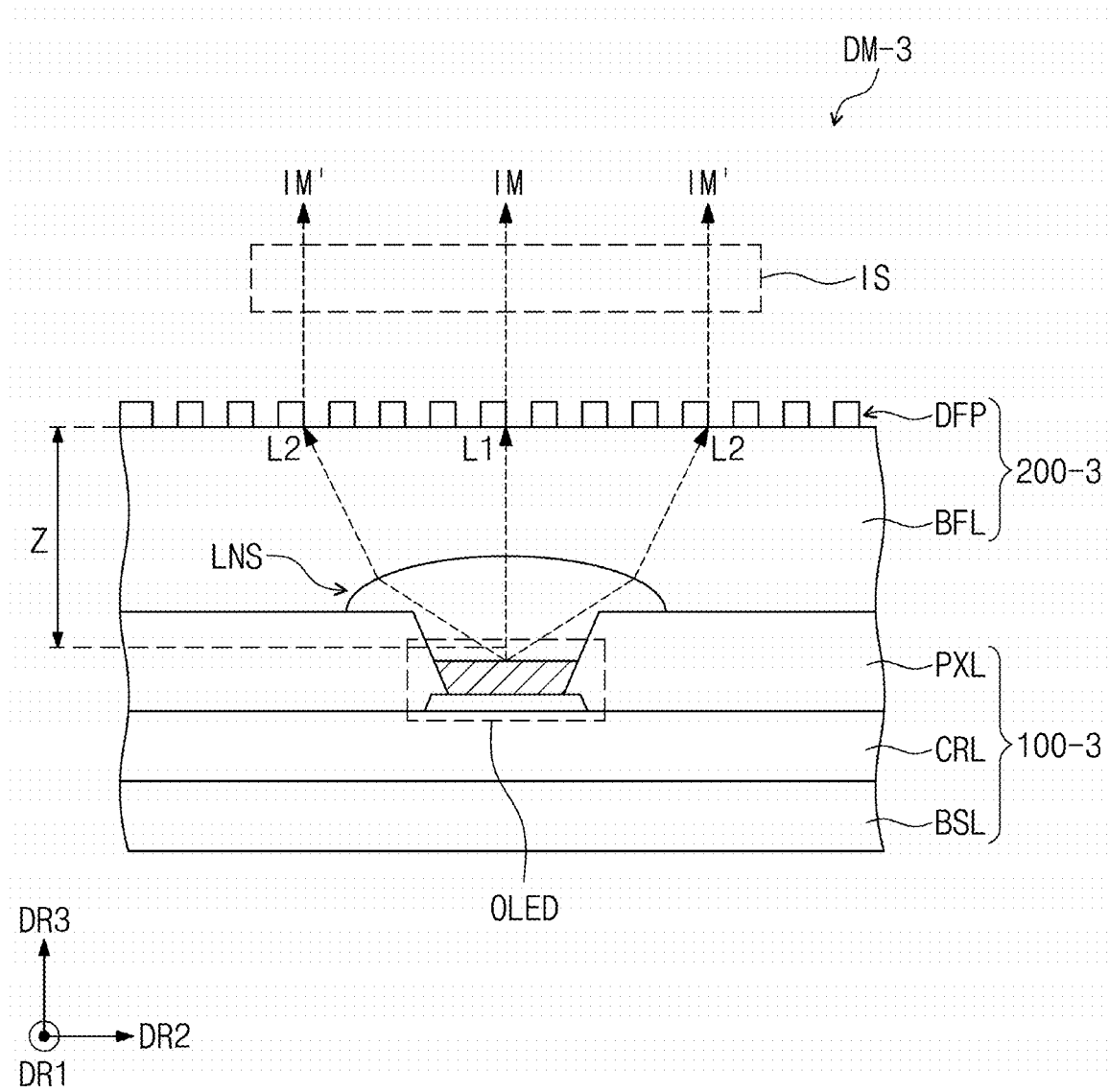
FIG. 16 is a cross-sectional view of a display module according to another embodiment of the invention.

FIG. 16 is a cross-sectional view of a display module according to another embodiment of the invention.

For ease of description, the following descriptions are focused on elements different from those in the embodiments described above. The same or like elements have been labeled with the same reference characters as used above to describe the embodiments above, and any repetitive detailed description thereof will hereinafter be omitted or simplified.

Referring to FIG. 16, a display panel 100-3 of a display module DM-3 does not include the protective layer PTL (FIG. 8). Therefore, the OLED of the display panel 100-3 may directly contact an optical member 200-3.

In such an embodiment, the light concentration layer CTL does not include the bottom layer BS (FIG. 4). Therefore, the light concentration lens LNS of the optical member 200-3 may directly contact the upper surface of the OLED.

According to an embodiment, the optical distance Z may further decrease in comparison with the above embodiments. In such an embodiment, the thickness of the display apparatus 1000 may further decrease.

Figure 17:
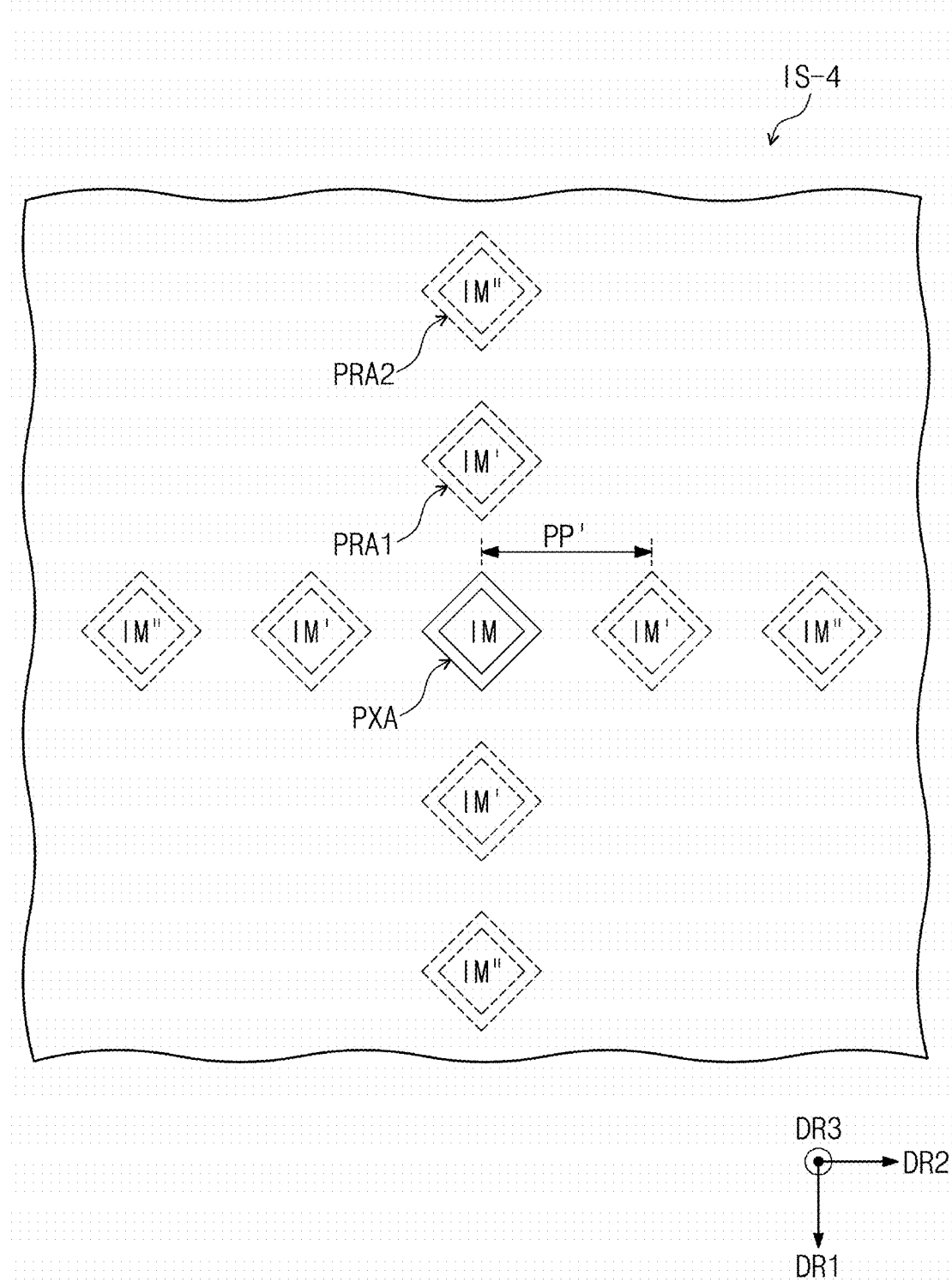
FIG. 17 is a front view of a display surface on which replication unit images are displayed according to another alternative embodiment of the invention.

FIG. 17 is a front view of a display surface on which replication unit images are displayed according to another alternative embodiment of the invention.

For ease of description, the following descriptions are focused on elements different from those in the embodiments described above. The same or like elements have been labeled with the same reference characters as used above to describe the embodiments above, and any repetitive detailed description thereof will hereinafter be omitted or simplified.

Referring to FIG. 17, in an embodiment, the plurality of light-emitting areas PXA, first replication areas PRA1, and second replication areas PRA2 may be defined on a display surface IS-4. The first replication areas PRA1 are arranged around one light-emitting area PXA among the plurality of light-emitting areas PXA. In such an embodiment, the first replication areas PRA1 may be defined at opposing sides of one light-emitting area PXA in the first direction DR1 and other opposing sides of the one light-emitting area PXA in the second direction DR2.

The second replication areas PRA2 are defined at outermost sides with respect to the one light-emitting area PXA. In such an embodiment, the first light-emitting area PXA1 may be defined between each of the second replication areas PRA2 and the one light-emitting area PXA.

According to an embodiment, the diffraction patterns DFP (FIG. 7) may diffract lights emitted from one OLED (not shown) to display a plurality of replication unit images IM' and IM'' on the display surface IS-4. The plurality of replication unit images IM' and IM'' display the same unit image as each other. The plurality of replication unit images IM' and IM'' include a plurality of first replication unit images IM' displayed in the first replication area PRA1 and a plurality of second replication unit images IM'' displayed in the second replication area PRA2.

In an embodiment, the distance between the center of the light-emitting area PXA and the center of the first replication area PRA1 is equal to the distance between the center of the first replication area PRA1 and the center of the second replication area PRA2. This distance is defined as a replication interval PP'. According to an embodiment, the replication interval PP' may be smaller than the replication interval PP described above with reference to FIG. 10.

According to an embodiment, the phenomenon in which the non-light-emitting area (not shown) is viewed from an outside may be more efficiently prevented. In such an embodiment, the display quality of the display apparatus 1000 may be further improved.

Figure 18:
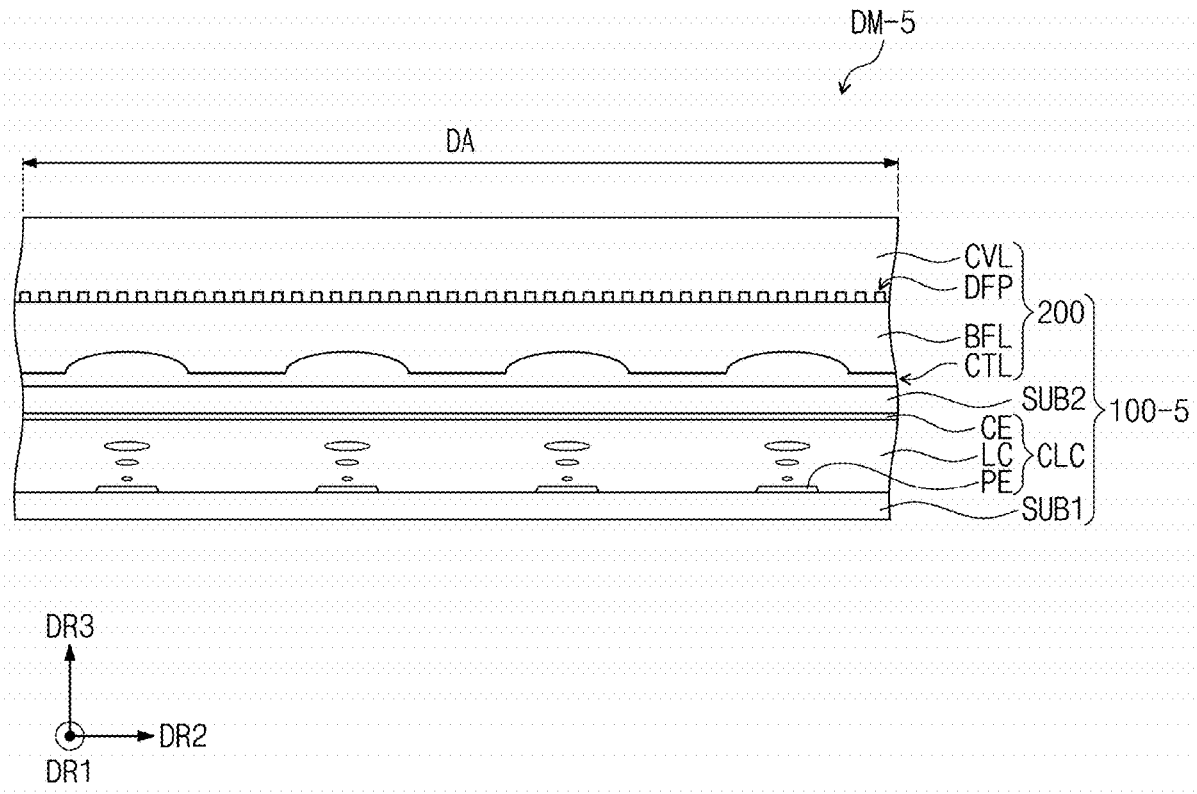
FIG. 18 is a cross-sectional view of a display module according to another embodiment of the invention.

FIG. 18 is a cross-sectional view of a display module according to another embodiment of the invention.

For ease of description, the following descriptions are focused on elements different from those in the embodiments described above. The same or like elements have been labeled with the same reference characters as used above to describe the embodiments above, and any repetitive detailed description thereof will hereinafter be omitted or simplified.

Referring to FIG. 18, in an embodiment, a display panel 100-5 of a display module DM-5 may be a liquid crystal display panel. In such an embodiment, the display device included in the display panel 100-5 may be a liquid crystal capacitor CLC.

In such an embodiment, the display panel 100-5 includes a first substrate SUB1, a second substrate SUB2, and a plurality of liquid crystal capacitors CLC. The first substrate SUB1 defines a rear surface of the display panel 100-5, and the second substrate SUB2 defines an upper surface of the display panel 100-5. The liquid crystal capacitors CLC may be arranged between the first substrate SUB1 and the second substrate SUB2.

The liquid crystal capacitor CLC includes a pixel electrode PE, a liquid crystal layer LC, and a common electrode CE. The pixel electrode PE is disposed on the first substrate SUB1. The pixel electrode PE corresponds to the above-mentioned light-emitting area PXA (FIG. 10). The plurality of liquid crystal capacitors CLC share the common electrode CE. The common electrode CE is disposed under the second substrate SUB2 to face the pixel electrode PE. The liquid crystal layer LC is interposed between the pixel electrode PE and the common electrode CE.

Although not illustrated in the drawings, an embodiment of a display apparatus including the display module DM-5 shown in FIG. 18 may further include a separate backlight unit.

Figure 19:
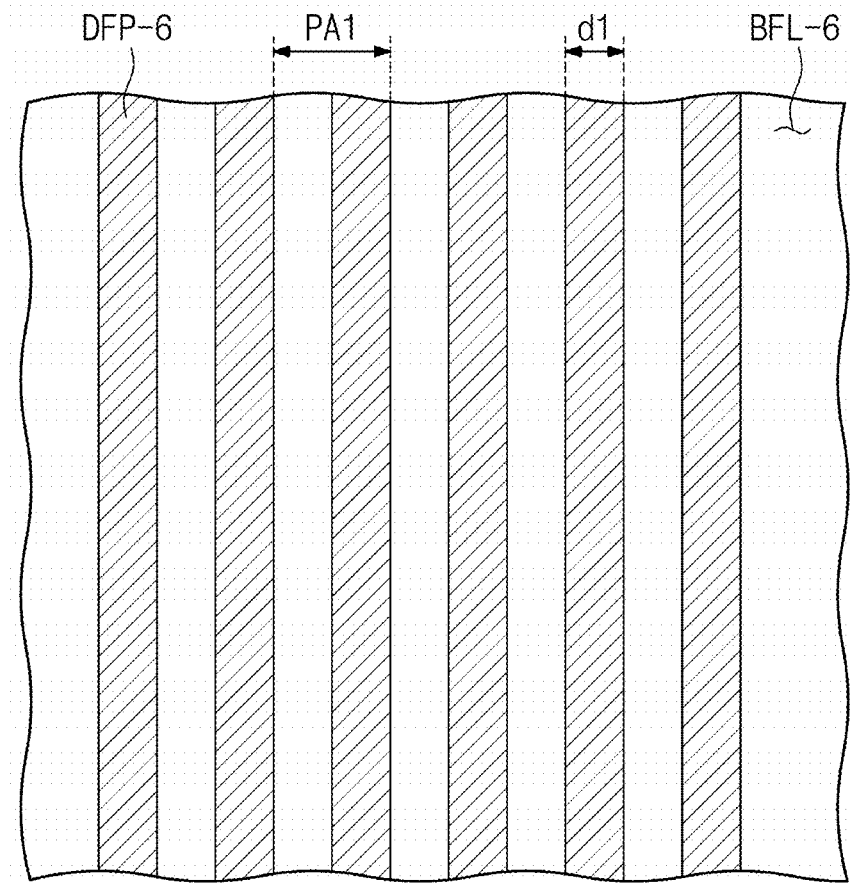
FIG. 19 is a plan view illustrating a diffraction pattern according to another alternative embodiment of the invention.

FIG. 19 is a plan view illustrating a diffraction pattern according to another alternative embodiment of the invention.

For ease of description, the following descriptions are focused on elements different from those in the embodiments described above. The same or like elements have been labeled with the same reference characters as used above to describe the embodiments above, and any repetitive detailed description thereof will hereinafter be omitted or simplified.

Referring to FIG. 19, in an embodiment, diffraction patterns DFP are arranged in a stripe form. In one embodiment, for example, the diffraction patterns DFP-6 extend in the first direction DR1 and are arranged in the second direction DR2 on a buffer layer BFL-6.

Although not illustrated in the drawings, in such an embodiment, where the diffraction patterns DFP-6 are arranged in one direction as shown in FIG. 19, a direction in which the replication unit images displayed by the diffraction patterns DFP-6 are arranged may be limited to the one direction.

Figure 20:
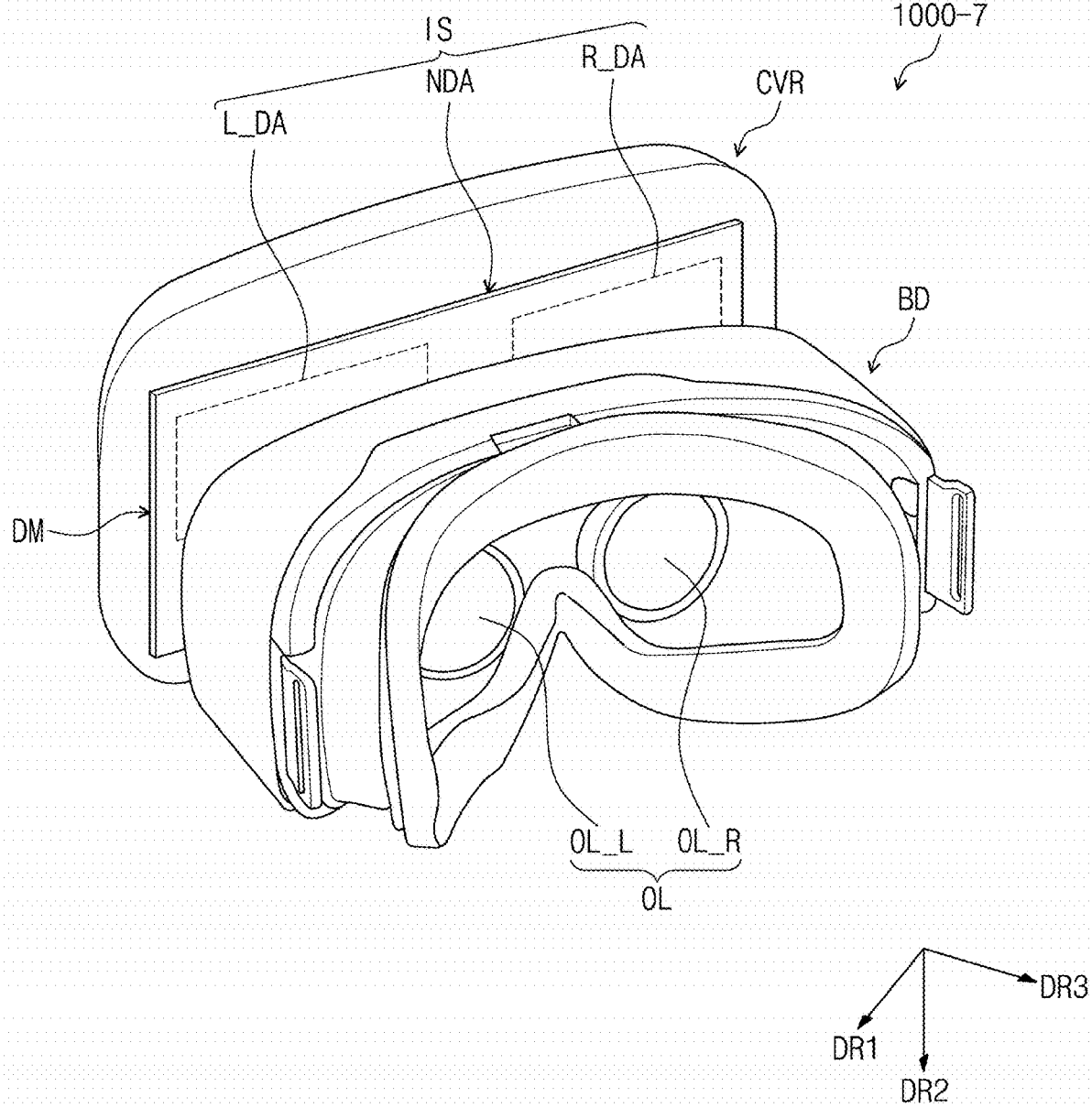
FIG. 20 is a perspective view of a display apparatus according to another alternative embodiment of the invention.
Figure 21:
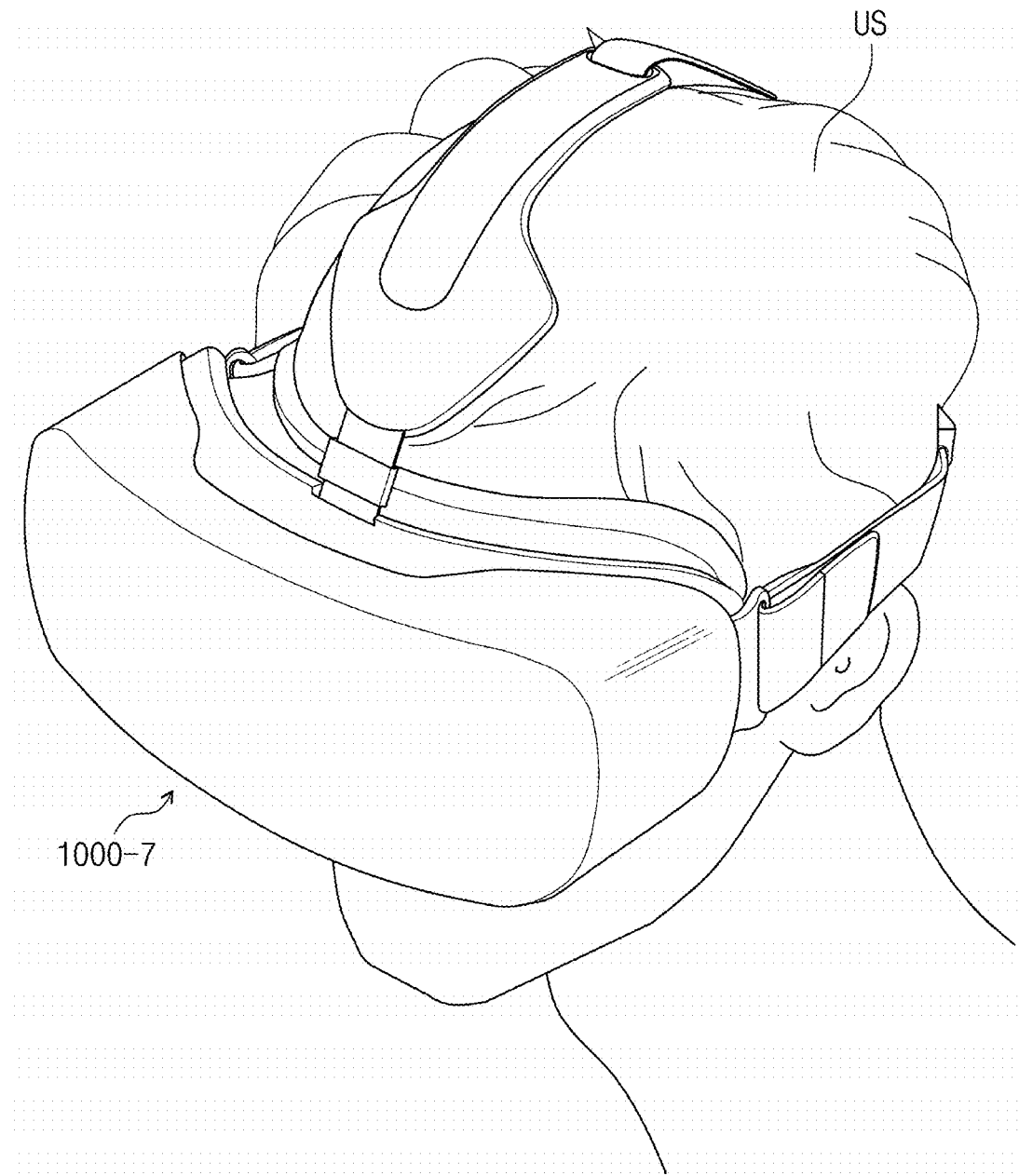
FIG. 21 is a diagram illustrating the display apparatus illustrated in FIG. 20 in an environment of use.
Figure 22:
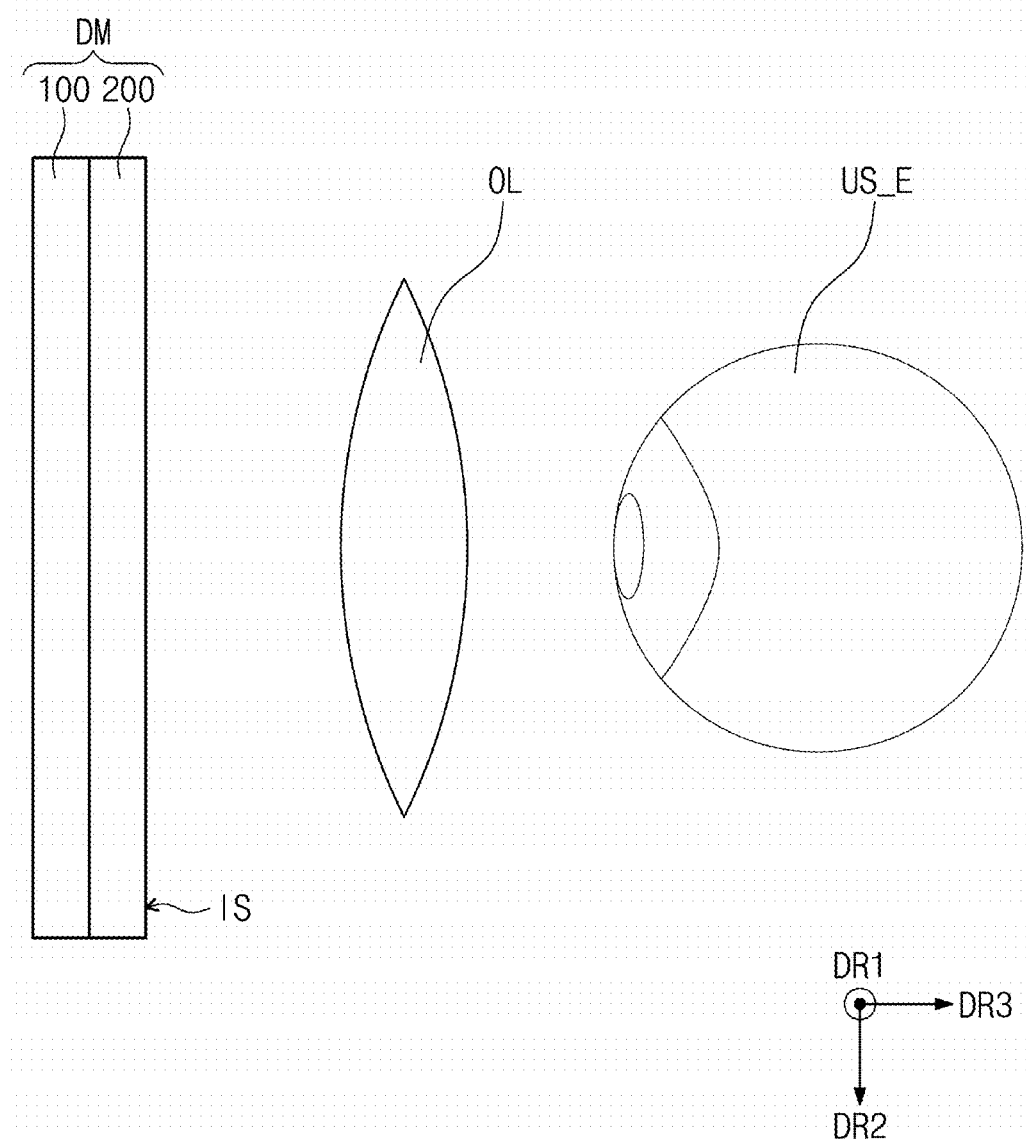
FIG. 22 is a schematic cross-sectional view of the display apparatus illustrated in FIG. 20.

FIG. 20 is a perspective view of a display apparatus according to another alternative embodiment of the invention, and FIG. 21 is a diagram illustrating the display apparatus illustrated in FIG. 20 in an environment of use. FIG. 22 is a schematic cross-sectional view of the display apparatus illustrated in FIG. 20.

For ease of description, the following descriptions are focused on elements different from those in the embodiments described above. The same or like elements have been labeled with the same reference characters as used above to describe the embodiments above, and any repetitive detailed description thereof will hereinafter be omitted or simplified.

Referring to FIGS. 20 to 22, in an embodiment, a display apparatus 1000-7 may be a head mount display. In such an embodiment, the display apparatus 1000-7 may be worn on a head of a user US. The display apparatus 1000-7 may provide an image to the user US in a state in which an actual peripheral vision of the user US is blocked. Thus, the user US wearing the display apparatus 1000-7 may be more easily immersed in a virtual reality.

In such an embodiment, the display apparatus 1000-7 includes a body part BD, a cover part CVR, and a display module DM. The body part BD may be worn on the head of the user US. The body part BD may be provided with a separate strap (not shown) so that the display apparatus 1000-7 may be worn on the head of the user US. The body part BD may include an optical system OL. The body part BD may accommodate components having various functions in addition to the optical system OL. In one embodiment, for example, an operation part (not shown) or the like for adjusting a sound volume, brightness of a screen, etc., may be additionally disposed on the outside of the body part BD. The operation part may be provided as a physical button or may be provided in a form of a touch sensor or the like. In such an embodiment, the body part BD may accommodate a proximity sensor (not shown) for determining whether the display apparatus 1000-7 is worn on the user US.

The cover part CVR covers the body part BD. The cover part CVR protects components accommodated in the body part BD.

The display module DM is disposed between the cover part CVR and the body part BD. The cover part CVR is coupled to the body part BD while covering the display module DM. Thus, the display module DM may be protected by the cover part CVR and the body part BD. The display module DM defines the display surface IS. The display surface IS is parallel with a plane defined by the first direction DR1 and the second direction DR2. An image may be displayed through a partial area of the display surface IS. A direction in which the image is displayed is the third direction DR3, where the third direction DR3 is defined as a direction from the display apparatus 1000-7 to the user US when the user US wears the display apparatus 1000-7, as shown in FIGS. 20 and 21.

In such an embodiment, as shown in FIG. 20, the display surface IS includes a right-eye display area R_DA, a left-eye display area L_DA, and a non-display area NDA.

The right-eye display area R_DA and the left-eye display area L_DA are spaced apart in the first direction DR1. The non-display area NDA is defined to surround each of the right-eye display area R_DA and the left-eye display area L_DA.

The user US receives an image displayed on the right-eye display area R_DA through a right eye, and receives an image displayed on the left-eye display area L_DA through a left eye.

According to an embodiment, the optical system OL may be spaced apart from a display module DM in the third direction DR3 in which an image is displayed. The optical system OL may be disposed between the display module DM and eyes USE of the user US.

The optical system OL enlarges the display surface IS of the display module DM to provide an enlarged view to the user US. The optical system OL may include a right-eye optical system OL_R and a left-eye optical system OL_L. The left-eye optical system OL_L enlarges an image to provide an enlarged image to a left pupil of the user US, and the right-eye optical system OL_R enlarges an image to provide an enlarged image to a right pupil of the user US. In such an embodiment, the optical system OL may include a convex spherical lens or aspherical lens.

The configuration of the display module DM is otherwise the same as the display modules of the above embodiments, and any repetitive detailed description thereof will be omitted.

In an embodiment, where the display apparatus is a head mount display, since the display surface IS is enlarged by the optical system OL, the phenomenon in which the non-light-emitting area (not shown) is viewed by a user US may be more significant in comparison with a case where the display surface IS is viewed as it is. According to an embodiment, even though the display surface IS is enlarged by the optical system OL, the phenomenon in which the non-light-emitting area (not shown) is viewed from the outside may be reduced as described above.

According to embodiments of the invention, the display quality of a display apparatus may be improved while reducing the thickness of the display apparatus. Furthermore, according to embodiments of the invention, the durability of a display apparatus may be improved.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display apparatus comprising:
    a display module defining a display surface in a surface thereof,
    wherein the display module comprises:
    a display panel comprising a plurality of display devices which displays an image on the display surface;
    a light concentration layer arranged on the display panel, the light concentration layer including a bottom layer and a plurality of light concentration lenses disposed on an upper surface of the bottom layer, each of the plurality of light concentration lenses is spaced apart from each other exposing the upper surface of the bottom layer;
    a buffer layer disposed on the plurality of light concentration lenses; and
    a plurality of diffraction patterns arranged at regular intervals on the buffer layer,
    wherein the plurality of diffraction patterns diffract lights incident thereto, and
    wherein the plurality of diffraction patterns comprises a plurality of first diffraction patterns and a plurality of second diffraction patterns,
    wherein the plurality of first diffraction patterns spaced apart from each other defining a first plurality of holes therebetween overlap each of the plurality of light concentration lenses and the plurality of second diffraction patterns spaced apart from each other defining a second plurality of holes overlap the upper surface of the bottom layer defined between adjacent condensing lenses of the plurality of condensing lenses.

2. The display apparatus of claim 1, wherein a portion of the lights diffracted by the plurality of diffraction patterns constructively interfere with each other.

3. The display apparatus of claim 2, wherein
    the plurality of display devices displays pixel unit images, respectively, on the display surface,
    the portion of the lights, which constructively interfere with each other, displays replication unit images on the display surface,
    the image is defined by the pixel unit images and the replication unit images, and
    each of the replication unit images is displayed between adjacent pixel unit images on the display surface.

4. The display apparatus of claim 1, wherein each of the plurality of display devices comprises an organic light-emitting device.

5. The display apparatus of claim 4, wherein the display panel further comprises a protective layer covering the organic light-emitting devices.

6. The display apparatus of claim 4, wherein the light concentration lenses are disposed overlapping upper surfaces of the display devices to cover the plurality of display devices.

7. The display apparatus of claim 4, wherein
    a distance from an upper surface of the light-emitting device to an upper surface of the buffer layer is defined as an optical distance, and
    the optical distance is in a range from about 50 μm to about 150 μm.

8. The display apparatus of claim 3, wherein the replication unit images are displayed by a red light.

9. The display apparatus of claim 8, wherein
    one of the adjacent pixel unit images is displayed by the red light, and another of the adjacent pixel unit images is displayed by a blue light.

10. The display apparatus of claim 3, wherein, on the display surface, a distance between a center of one pixel unit image adjacent to a replication unit image, among the pixel unit images, and a center of the replication unit image is about 25 µm or less.

11. The display apparatus of claim 3, wherein
a plurality of replication unit images are displayed between adjacent pixel unit images on the display surface,
the plurality of replication unit images comprise:
a first replication unit image disposed adjacent to one pixel unit image of the adjacent pixel unit images on the display surface; and
a second replication unit image facing the one pixel unit image with the first replication unit images therebetween.

12. The display apparatus of claim 1, wherein an interval between the plurality of diffraction patterns is in a range from about 4.5 µm to about 7.5 µm.

13. The display apparatus of claim 1, wherein a radius of curvature of each of the plurality of light concentration lenses is in a range from about 7 µm to about 14 µm.

14. The display apparatus of claim 1, wherein a refractive index of the buffer layer is lower than a refractive index of each of the plurality of light concentration lenses.

15. The display apparatus of claim 1, wherein a refractive index of the plurality of diffraction patterns is the same as a refractive index of the buffer layer.

16. The display apparatus of claim 1, further comprising:
a sub-buffer layer disposed between the plurality of light concentration lenses and the display panel.

17. The display apparatus of claim 3, further comprising:
an input sensing layer disposed on the display module,
wherein the input sensing layer comprises a plurality of input sensing electrodes.

18. The display apparatus of claim 3, further comprising:
a reflection preventive layer disposed on the display module,
wherein the reflection preventive layer comprises:
a phase delay layer which delays a component of incident light; and
a polarization layer disposed on the phase delay layer.

19. The display apparatus of claim 3, wherein the plurality of diffraction patterns is in a matrix form.

20. The display apparatus of claim 3, wherein the plurality of diffraction patterns is in a stripe form.

21. The display apparatus of claim 3, wherein an area occupied by each of the plurality of light concentration lenses in a plan view is larger than an area occupied by each of the display devices in a plan view.

22. The display apparatus of claim 3, wherein the display module further comprises a cover layer covering the plurality of diffraction patterns.

23. The display apparatus of claim 1, further comprising:
an optical system disposed in a path of light emitted from the display module to enlarge the image displayed on the display surface,
wherein the display surface comprises a left-eye image display area and a right-eye image display area.

24. The display apparatus of claim 3, wherein
each of the plurality of display devices comprises a liquid crystal capacitor,
the liquid crystal capacitor comprises:
a pixel electrode corresponding to one of the pixel unit images;
a common electrode disposed on the pixel electrode; and
a liquid crystal layer interposed between the pixel electrode and the common electrode.

25. A display apparatus comprising:
a display module defining a display surface comprising a plurality of light-emitting areas and a plurality of replication areas in a surface thereof,
wherein the display module comprises:
a display panel which displays an image on each of the light-emitting areas;
a light concentration layer arranged between the display panel and the display surface, the light concentration layer including a bottom layer and a plurality of light concentration lenses disposed on an upper surface of the bottom layer, each of the plurality of light concentration lenses is spaced apart from each other exposing the upper surface of the bottom layer, wherein the plurality of light concentration lenses change a direction of light incident thereto into a direction closer to a direction towards the display surface;
a buffer layer disposed between the light concentration lenses and the display surface; and
a plurality of diffraction patterns are arranged between the buffer layer and the display surface at regular intervals on the buffer layer, wherein the plurality of diffraction patterns diffract light incident thereto to display an image on each of the plurality of replication areas,
wherein the plurality of replication areas are arranged around one of the plurality of light-emitting areas on the display surface, and
wherein the plurality of diffraction patterns comprises a plurality of first diffraction patterns and a plurality of second diffraction patterns,
wherein the plurality of first diffraction patterns spaced apart from each other defining a first plurality of holes therebetween overlap each of the plurality of light concentration lenses and the plurality of second diffraction patterns spaced apart from each other defining a second plurality of holes overlap the upper surface of the bottom layer defined between adjacent condensing lenses of the plurality of condensing lenses.

26. A display apparatus comprising:
a display module defining a display surface comprising a right-eye display area and a left-eye display area, wherein the display module emits light; and
an optical system comprising a lens disposed in a path of the light emitted from the display module to enlarge an image display by the light,
wherein the display module comprises:
a display panel comprising a plurality of pixels which displays an image on the right-eye display area and the left-eye display area;
a light concentration layer arranged on the display panel, the light concentration layer including a bottom layer and a plurality of light concentration lenses disposed on an upper surface of the bottom layer, each of the plurality of light concentration lenses is spaced apart from each other exposing the upper surface of the bottom layer;
a buffer layer disposed on the plurality of light concentration lenses; and
a plurality of diffraction patterns arranged at regular intervals on the buffer layer, wherein the plurality of diffraction patterns diffract a portion of lights incident thereto, and wherein the plurality of diffraction patterns comprises a plurality of first diffraction patterns and a plurality of second diffraction patterns, wherein the plurality of first diffraction patterns spaced apart from each other defining a first plurality of holes therebetween overlap each of the plurality of light concentration lenses and the plurality of second diffraction patterns spaced apart from each other defining a second plurality of holes overlap the upper surface of the bottom layer defined between adjacent condensing lenses of the plurality of condensing lenses.

* * * * *